US006999340B2

(12) United States Patent
Shimizu

(10) Patent No.: US 6,999,340 B2
(45) Date of Patent: Feb. 14, 2006

(54) SEMICONDUCTOR MEMORY DEVICE INCLUDING REFERENCE MEMORY CELL AND CONTROL METHOD

(75) Inventor: Yuui Shimizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 10/792,324

(22) Filed: Mar. 4, 2004

(65) Prior Publication Data

US 2004/0228198 A1 Nov. 18, 2004

(30) Foreign Application Priority Data

Mar. 13, 2003 (JP) ............................. 2003-067901

(51) Int. Cl.
*G11C 11/00* (2006.01)
(52) U.S. Cl. ..................... 365/158; 365/209; 365/171
(58) Field of Classification Search ................ 365/209, 365/171, 173, 158
See application file for complete search history.

(56) References Cited

U.S. PATENT DOCUMENTS

| 6,055,178 | A | 4/2000 | Naji |
| 6,081,445 | A | 6/2000 | Shi et al. |
| 6,317,376 | B1 | 11/2001 | Tran et al. |
| 6,680,863 | B1 * | 1/2004 | Shi et al. ..................... 365/171 |
| 2003/0031046 | A1 * | 2/2003 | Hidaka ....................... 365/171 |

FOREIGN PATENT DOCUMENTS

JP 2003242771 8/2003

OTHER PUBLICATIONS

R. Scheuerlein, et al., IEEE International Solid-State Circuits Conference, Digest paper, pp. 128-129, "TA 7.2 A 10NS Read and Write Non-Volatile Memory Array Using a Magnetic Tunnel Junction and FET Switch in Each Cell", 2000.
M. Durlam, et al., IEEE International Solid-State Circuits Conference, Digest Paper, pp. 130-131, "TA 7.3 Nonvolatile RAM Based on Magnetic Tunnel Junction Elements", 2000.

* cited by examiner

*Primary Examiner*—Huan Hoang
(74) *Attorney, Agent, or Firm*—Oblon, Spivak, McClelland, Maier & Neustadt, P.C.

(57) ABSTRACT

A semiconductor memory device includes word lines, bit lines, first memory cells, second memory cells, a memory cell array, a row decoder, a row driver, a column decoder, a column driver, and a sense amplifier. The first memory cell includes a magneto-resistive element which has either a first resistance or a second resistance smaller than the first resistance. The second memory cell includes a magneto-resistive element which has a resistance between the first and second resistances. The memory cell array includes the first and second memory cells disposed in intersections of the word line and bit line. The row driver supplies a first write current to the word line. The column driver supplies a second write current to the bit line. The sense amplifier amplifies data read from the first memory cell.

35 Claims, 14 Drawing Sheets

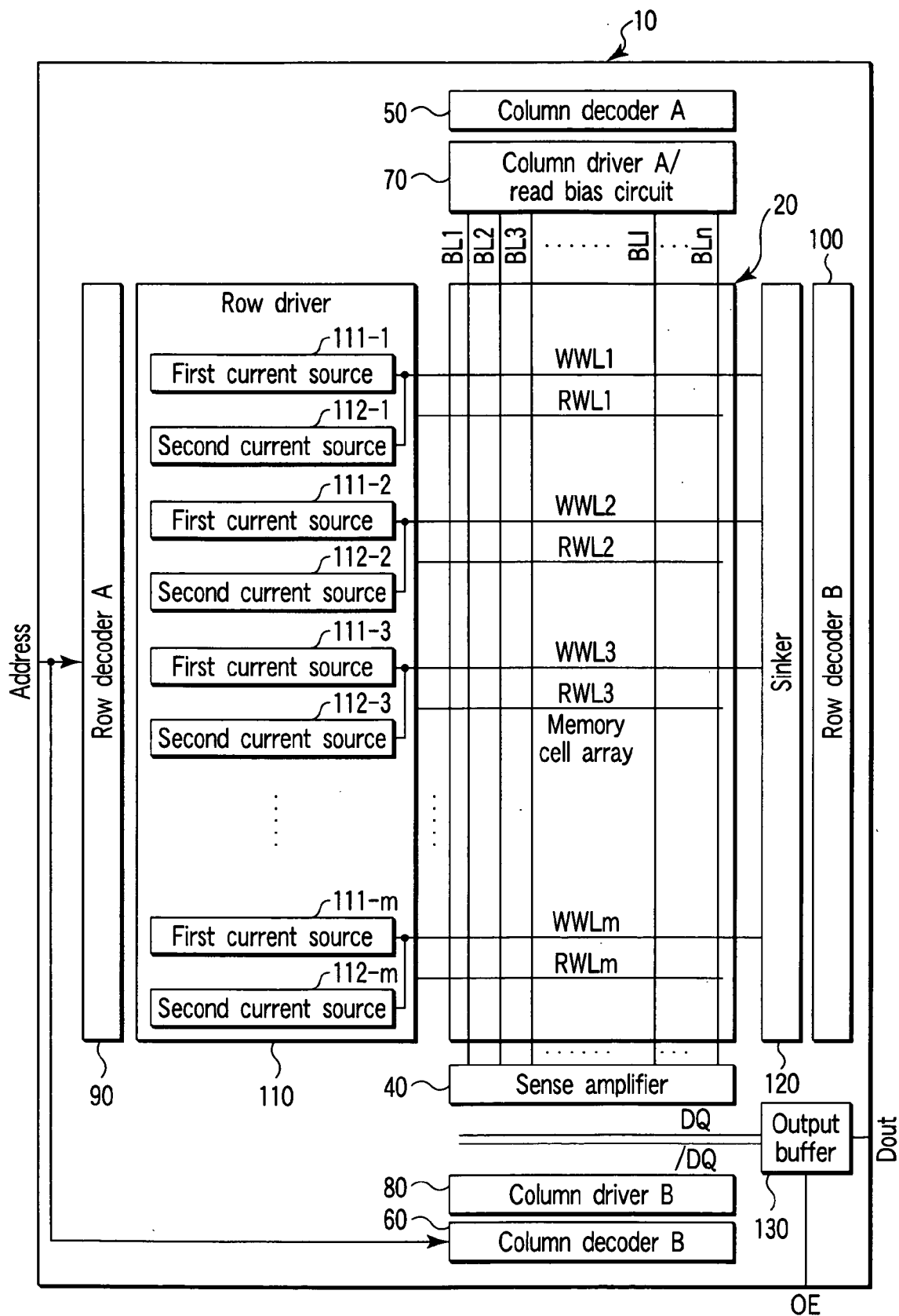
F I G. 1

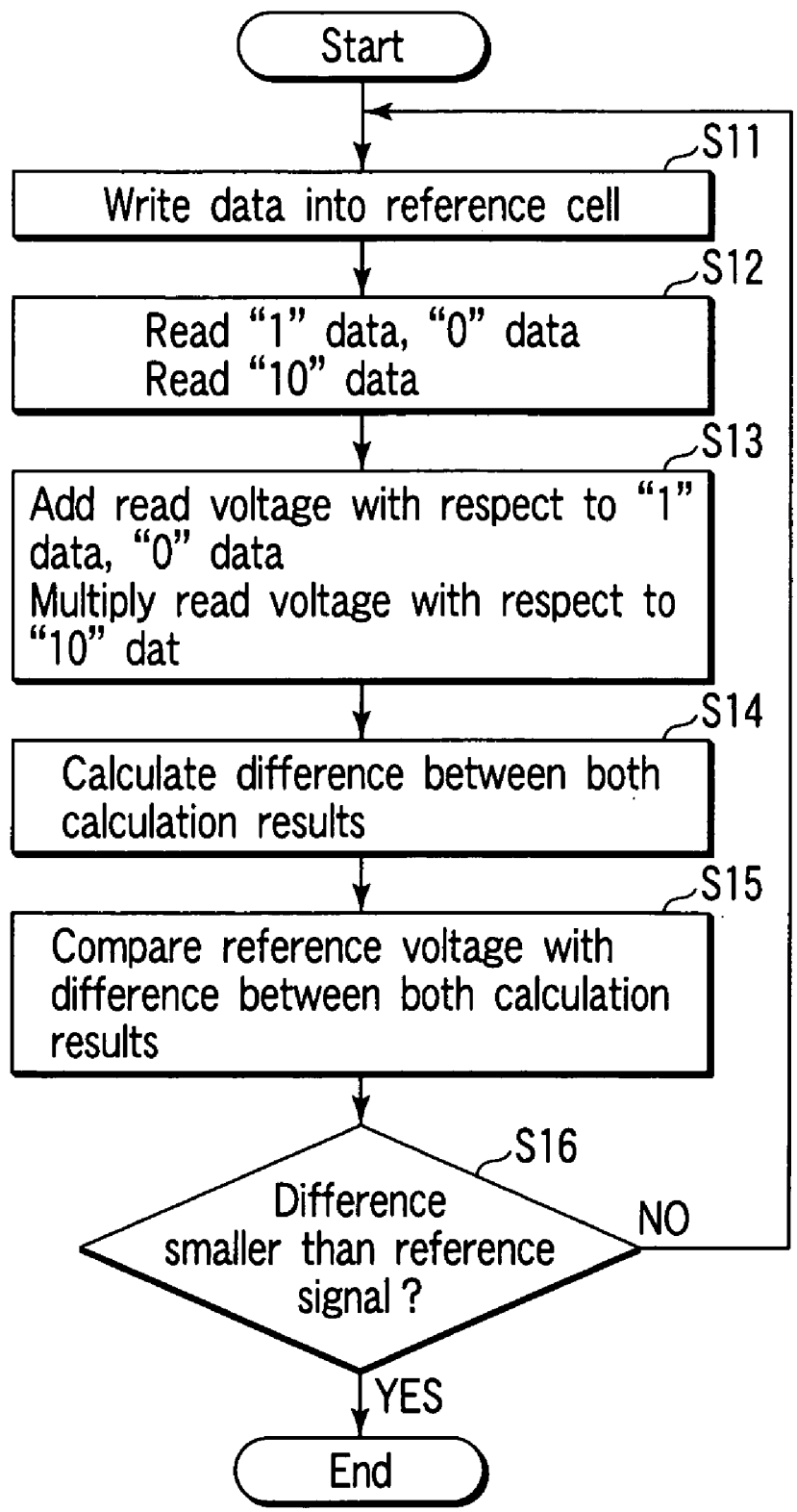
F I G. 14

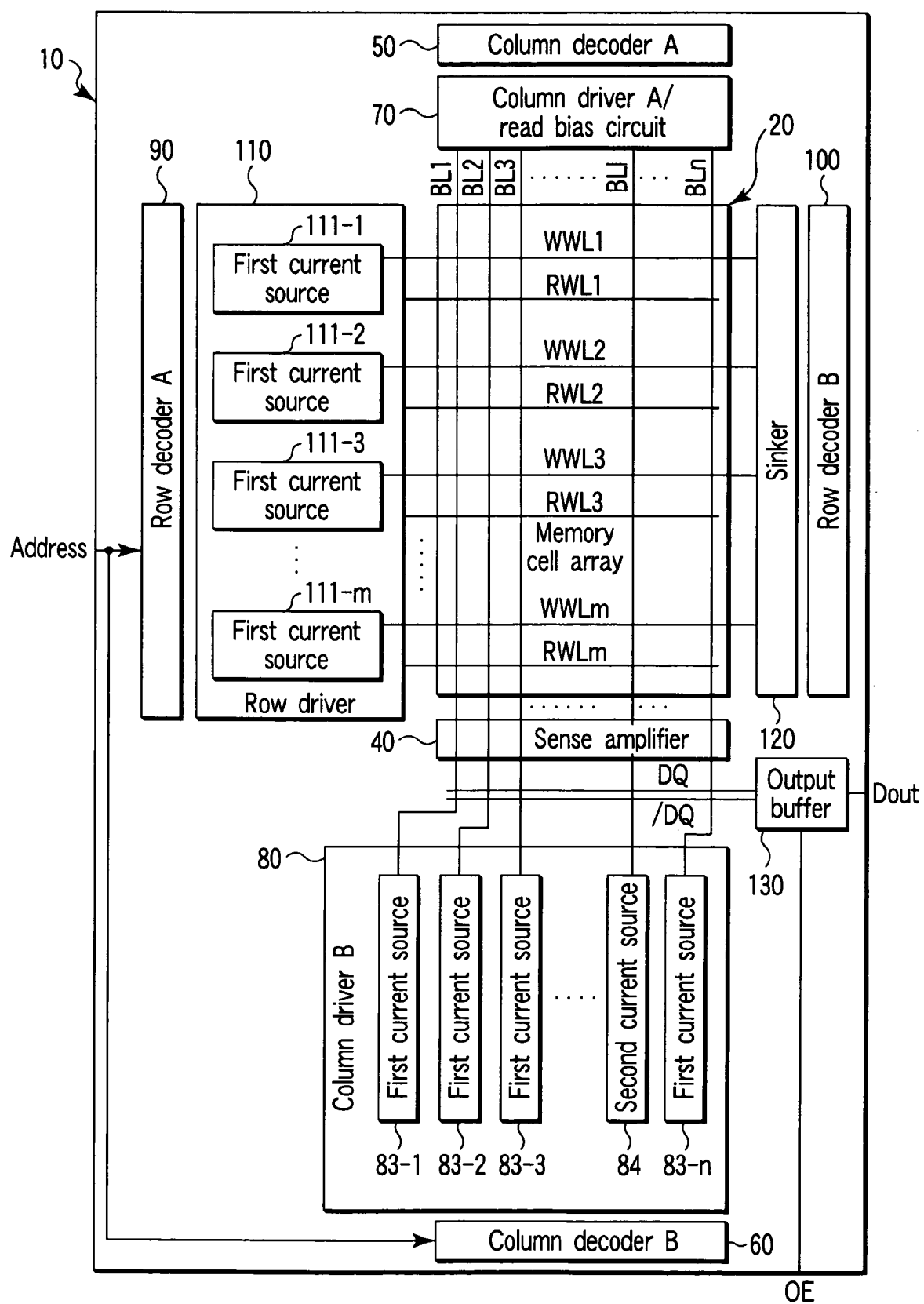
F I G. 15

SEMICONDUCTOR MEMORY DEVICE INCLUDING REFERENCE MEMORY CELL AND CONTROL METHOD

CROSS-REFERENCE TO RELATED APPLICATIONS

This application is based upon and claims the benefit of priority from the prior Japanese Patent Application No. 2003-067901, filed Mar. 13, 2003, the entire contents of which are incorporated herein by reference.

BACKGROUND OF THE INVENTION

1. Field of the Invention

The present invention relates to a semiconductor memory device and control method, for example, to a read operation of a magneto-resistive random access memory (MRAM).

2. Description of the Related Art

The MRAM is a device which uses a magneto-resistive effect to store "1" or "0" information and to perform a memory operation. Moreover, the device has a nonvolatile property, high integration property, and high reliability, also performs a high-speed operation, and is expected as a memory device which can replace to a related-art dynamic random access memory (DRAM) and electrically erasable and programmable read only memory (EEPROM).

In the MRAM, a magneto tunneling junction (MTJ) element using a variation of a magneto-resistance by a spin polarized tunnel effect is used in a memory cell. The memory cell is proposed, for example, in "IEEE International Solid-State Circuits Conference 2000 Digest Paper", TA7.2, "IEEE International Solid-State Circuits Conference 2000 Digest Paper", TA7.3 (FIG. 4), and the like. For these memory cells, for example, one MTJ element and MOS transistor are connected in series. The MOS transistor is used for selecting the memory cell. Furthermore, in Jpn. Pat. Appln. KOKAI Publication No. 2003-242771 (FIG. 6), a cross point type memory cell is disclosed.

The MTJ element is formed by a laminate film in which mainly an insulating film is held between two metal magnetic materials. Moreover, directions of spins of two magnetic materials are set to be parallel or anti-parallel to each other to allow two states. That is, a magnitude of a current tunneling and flowing through the insulating film in a case in which magnetization directions of two magnetic films are the same is larger than that in a case in which the magnetization directions of two magnetic films are opposite to each other. Furthermore, in other words, when the magnetization directions of two magnetic films are set to be opposite to each other, a resistance value between the magnetic films can be increased as compared with the case in which the magnetization directions of two magnetic films are the same. Therefore, when the difference of the resistance value of the MTJ element is large, the data is preferably read.

To read the data from the memory cell, the current flowing between the magnetic films via the insulating film is detected, or the current value is converted to a voltage and detected.

Next, a write operation of MRAM will be described. At a write operation, usually the magnetization direction of either one of two magnetic films is fixed and is prevented from being influenced by an external magnetic field. Here, the magnetic field whose magnetization direction is fixed is referred to as a pinning layer. The magnetization direction of the other magnetic field is set to be the same as or opposite to that of the pinning layer in accordance with an applied magnetic field. Here, the magnetic field whose magnetization direction is controlled is referred to as a free layer. The magnetization direction of the free layer is controlled by the direction of the magnetic field generated by the current flowing through a bit line and write word line passed through the memory cell. At this time, a half amount of a current amount necessary for changing the magnetization is respectively supplied to the bit line and word line. This prevents a non-selected memory cell from being wrongly rewritten. This technique is disclosed, for example, in U.S. Pat. No. 6,081,445.

Additionally, at the read operation of the data, a small voltage of about several hundreds of millivolts is applied to the memory cell. By this applied voltage, the current flowing through the memory cell is detected. At this time, a reference signal to be compared with the detected current value is necessary.

To obtain the signal for the reference, there is a method comprising: writing signals complementary to each other in two memory cells so that one bit includes two memory cells. According to the present method, at the read operation, the current amounts from two memory cells are compared with each other to judge the data.

Moreover, there is a method of adjusting a gate voltage of a MOS transistor connected in series to the MTJ element to set the resistance value between high and low resistance values of the memory cell. This technique is disclosed, for example, in U.S. Pat. No. 6,055,178.

As described above, in the related-art MRAM, the reference signal to be compared with the read data is required at the read operation of the data. Moreover, various methods for generating the reference signal have been proposed. However, in the method of writing the signals complementary to each other in two memory cells, only one bit data can be held by two memory cells. Therefore, the method is sometimes unsuitable for a memory cell array which has a large capacity since the method doesn't shows good scalability.

Moreover, in a method of adjusting a gate voltage of the MOS transistor in the memory cell, the resistance value of the memory cell to generate the reference signal largely depends on characteristics of the MOS transistor. Therefore, there has been a tendency that the reliability of the reference signal has uncertainty.

BRIEF SUMMARY OF THE INVENTION

A semiconductor memory device according to an aspect of the present invention includes, a plurality of word lines formed along a first direction; a plurality of bit lines formed along a second direction crossing at right angles to the first direction; a first memory cell including a magneto-resistive element which has either a first resistance or a second resistance smaller than the first resistance; a second memory cell including a magneto-resistive element which has a resistance between the first and second resistances; a memory cell array including the first and second memory cells disposed at intersections of a word line and bit lines; a row decoder which selects the word line; a row driver including a first current source that supplies a first write current to the word line selected by the row decoder and a second current source that supplies a second write current to the word line selected by the row decoder, an absolute value of the second write current being smaller than that of the first write current, the first current source supplying the first write current to the word line such that the magneto-resistive element of the first memory cell has either the first or second resistance to perform a write operation, and the second current source supplying the second write current to the word line such that the magneto-resistive element of the second memory cell has a resistance between the first and second resistances; a column decoder which selects a bit line; a column driver which supplies a third write current to the bit line selected by the column decoder; and a sense amplifier which amplifies data read from the first memory cell selected by the row decoder and column decoder.

A control method of a semiconductor memory device according to another aspect of the present invention includes, writing first data in a memory cell including a first magneto-resistive element, and writing second data in a reference cell including a second magneto-resistive element, the first magneto-resistive element of the memory cell in which the first data is written having either a first resistance or a second resistance smaller than the first resistance, the second magneto-resistive element of the reference cell in which the second data is written having a resistance between the first and second resistances; precharging a bit line; reading the first and second data in the bit line from the memory cell and reference cell; and amplifying the first data read in the bit line based on the second data. The memory cell and reference cell are disposed at an intersection of the bit line and word lines crossing at right angles to the bit line, and an absolute value of the write current supplied to the bit line and word line in writing the second data in the reference cell is smaller than that of the write current supplied to the bit line and word line in reversing the data held in the memory cell to write the first data in the memory cell.

BRIEF DESCRIPTION OF THE SEVERAL VIEWS OF THE DRAWING

FIG. 1 is a block diagram of MRAM according to a first embodiment of the present invention;

FIG. 14 is a flowchart showing a control method of the MRAM according to the third embodiment of the present invention;

FIG. 15 is a block diagram of the MRAM according to a modification example of the first to third embodiments of the present invention;

DETAILED DESCRIPTION OF THE INVENTION

Figure 2:
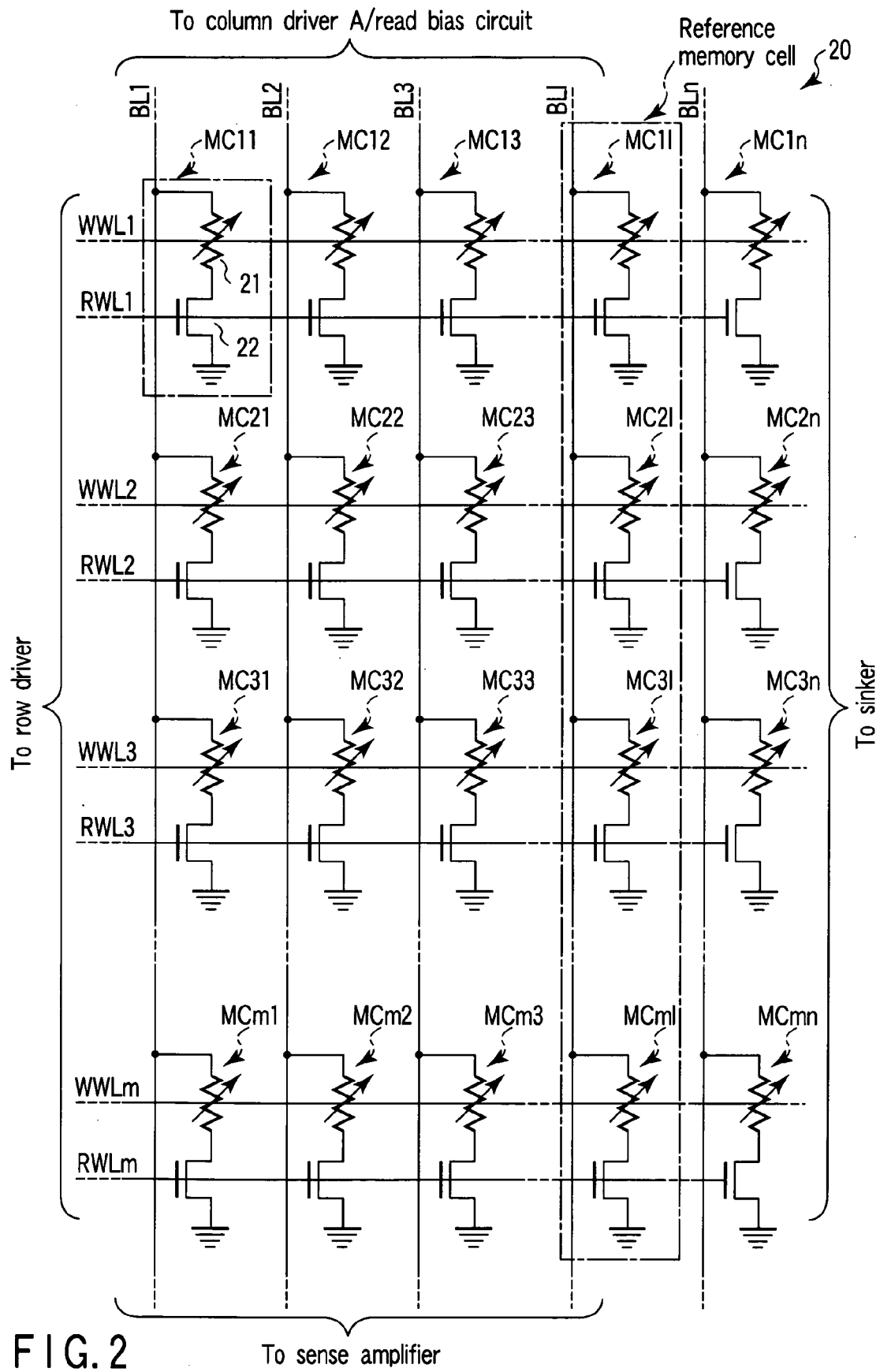
FIG. 2 is a circuit diagram of a memory cell array disposed in the MRAM according to the first embodiment of the present invention.

A semiconductor memory device according to a first embodiment of the present invention will be described with reference to FIG. 1. FIG. 1 is a block diagram of MRAM according to the present embodiment.

As shown, a MRAM 10 includes a memory cell array 20, sense amplifier 40, column decoder A 50, column decoder B 60, column driver A/read bias circuit 70, column driver B 80, row decoder A 90, row decoder B 100, row driver 110, sinker 120, and output buffer 130.

In the memory cell array 20, write word lines WWL1 to WWLm (m: natural number) and read word lines RWL1 to RWLm are formed along a predetermined direction (first direction), and bit lines BL1 to BLn (n: natural number) are formed along a direction (second direction) crossing at right angles to the first direction. One end of the write word lines WWL1 to WWLm and read word lines RWL1 to RWLm is connected to the row driver 110, and the other end of the write word lines WWL1 to WWLm is connected to the sinker 120. Moreover, one end of the bit lines BL1 to BLn is connected to the column driver A/read bias circuit 70, and the other end is connected to the sense amplifier 40 and column driver B 80.

Further in the memory cell array 20, the memory cells are disposed in the intersections of the write word lines WWL1 to WWLm, read word lines RWL1 to RWLm, and bit lines BL1 to BLn. The memory cells include magneto-resistive element, and are arranged in a matrix form. Furthermore, the memory cells of the same row are connected in common to any one of the read word lines RWL1 to RWLm, and the memory cells of the same column are connected in common to any one of the bit lines BL1 to BLn. Further in the vicinity of the memory cells of the same row, any one of the write word lines WWL1 to WWLm is disposed.

The further detail of the memory cell array 20 will be described with reference to FIG. 2. FIG. 2 is a circuit diagram of the memory cell array 20.

As shown, the memory cell array 20 includes a plurality of (m×n) memory cells arranged in a matrix form. Each of the memory cells includes a magneto-resistive element 21 and selection transistor 22. The magneto-resistive element 21 is, for example, an MTJ element. One end of the magneto-resistive elements 21 arranged in the same column is connected in common to any one of bit lines BLn, and the other end is connected to one end of a current path of the selection transistor 22. A gate of the selection transistors 22 arranged in the same row is connected in common to any one of the read word lines RWL1 to RWLm, and the other end of the current path is connected to a ground potential. Moreover, any one of the write word lines WWL1 to WWLm is disposed in the vicinity of the magneto-resistive elements 21 disposed in the same row.

In the memory cell array, memory cells MC11 to MCm1 connected to the bit line BLl function as reference memory cells. That is, the memory cell does not function as the usual memory cell for storing the data (hereinafter referred to as the usual memory cell), and is disposed to generate the reference signal at a read operation. The details of this respect will be described later. The memory cells connected to the bit lines BLl to BL(l−1) and bit lines BL(l+1) to BLn, other than the bit line BLl, function as the usual memory cells.

Figure 3A:
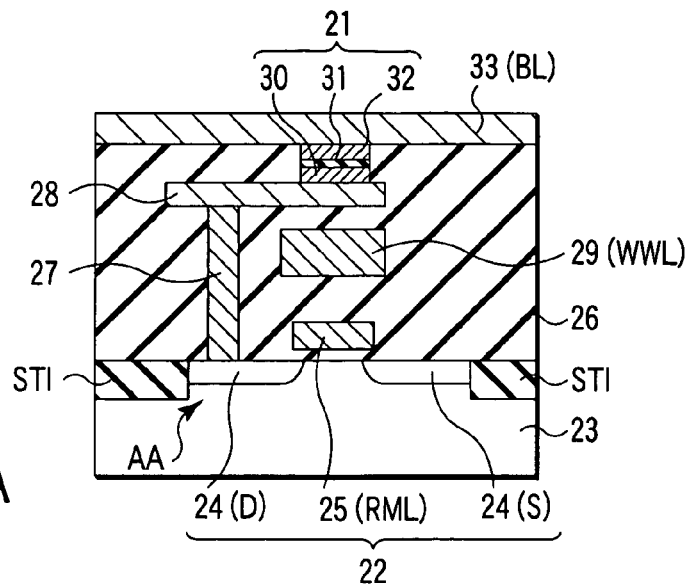
FIG. 3A is a sectional view of a memory cell disposed in the MRAM according to the first embodiment of the present invention.

Next, a sectional structure of the memory cell will be described with reference to FIG. 3A. FIG. 3A is a sectional view along a bit line direction of the memory cell.

As shown, an element isolating region STI is formed in a semiconductor substrate 23, and a selection transistor 21 is formed in an element region AA whose periphery is surrounded by the element isolating region. The selection transistor 21 includes an impurity diffusion layer 24 formed in the surface of the semiconductor substrate 23, a gate insulating film (not shown), and a gate electrode 25. The gate electrode 25 functions as any one of the read word lines RWL1 to RWLm, and is formed in a striped shape in a direction vertical to the sheet surface of the drawing. An interlayer insulating film 26 is formed on the semiconductor substrate 23, and the selection transistor 21 is coated with the interlayer insulating film 26.

A contact plug 27 is formed in the interlayer insulating film 26. The contact plug 27 is connected to one (drain region) of the impurity diffusion layers 24 of the selection transistor 21. It is to be noted that the other impurity diffusion layer 24 (source region) of the selection transistor 21 is connected to the ground potential in the region (not shown). Moreover, a metal wire layer 28 connected to the contact plug 27, and a metal wire layer 29 electrically separated from the metal wire layer 28 are formed in the interlayer insulating film 26. The metal wire layer 29 functions as any one of the write word lines WWL1 to WWLm, and is formed in the striped shape in the direction vertical to the sheet surface. Moreover, the metal wire layer 29 is formed to substantially overlap with the gate electrode 25 of the selection transistor 21.

The magneto-resistive element 21 is formed on the metal wire layer 28. The magneto-resistive element 21 is formed to be stacked on the gate electrode 25 with the interlayer insulating film 26 and metal wire layer 29 interposed therebetween. The magneto-resistive element 21 is an MTJ element structured to hold the insulating film between magnetic films. That is, a magnetic film 30 is formed on the metal wire layer 28, an insulating film 31 is formed on the magnetic film 30, and a magnetic film 32 is formed on the insulating film 31. These magnetic films 30, 32, and the insulating film 31 form the MTJ element. The direction of spin of the magnetic film 30 is set to be directed in a predetermined direction beforehand. Additionally, the direction of spin of the magnetic film 32 is disposed in parallel or anti-parallel with respect to the magnetic film 30, thereby two states are allowed, and "0" data or "1" data is written. Furthermore, a metal wire layer 33 is formed on the interlayer insulating film 26 so as to be connected to the magnetic film 32. The metal wire layer 33 functions as any one of the bit lines BL1 to BLn, and is formed in the stripe shape in the direction crossing at right angles to the gate electrode 25 and metal wire layer 29 (leftward/rightward direction in the sheet surface).

Figure 3B:
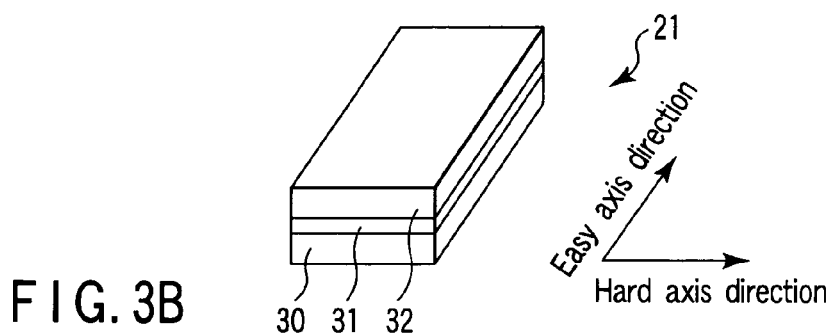
FIG. 3B is a perspective view of the memory cell disposed in the MRAM according to the first embodiment of the present invention.

FIG. 3B is a perspective view of the magneto-resistive element. As shown, an upper surface shape of the magneto-resistive element 21 is a substantially rectangular shape. Moreover, a longitudinal direction (magnetization easy-axis) extends along the gate electrode (RWL1 to RWLm) 25 and metal wire layer (WWL1 to WWLm) 29, and a short-side direction (magnetization hard-axis) is formed along the metal wire layer (BL1 to BLn) 33. This relation is satisfied, when write data is controlled by the direction of the current passed through the bit lines BL1 to BLn. When the write data is controlled by the direction of the current passed through the write word lines WWL1 to WWLm, the long-side and short-side directions of the magneto-resistive element have an opposite relation.

Figures 4A, 4B:
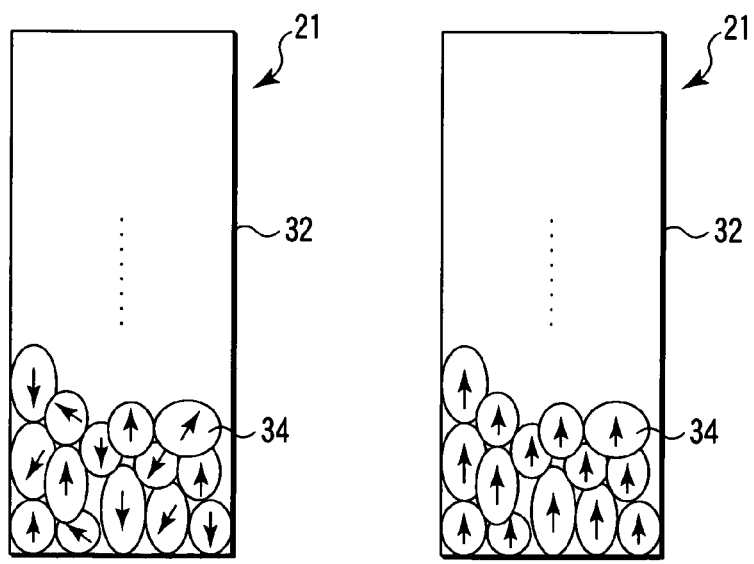
FIG. 4A is a top plan view of the memory cell disposed in the MRAM according to the first embodiment of the present invention, and is a diagram showing that a magnetic field not more than a write threshold value is applied.
FIG. 4B is a top plan view of the memory cell disposed in the MRAM according to the first embodiment of the present invention, and shows that the magnetic field not less than the write threshold value is applied.

FIGS. 4A and 4B are top plan views of the magneto-resistive element 21. Especially they show the magneto-resistive elements 21 incorporated in reference memory cells MC11 to MCm1.

As shown, the magnetic film 32 (or the opposite films 30, 32) of the selection transistor 21 has a multi domain. That is, a plurality of magnetic domains 34 are included. As shown in FIG. 4A, the directions of spins (magnetic moment) of the respective magnetic domains 34 are scattered before the magnetic field is applied. However, when a constant or more magnetic field is added, as shown in FIG. 4B, the directions of spins of the respective magnetic domains 34 are aligned in the direction of the magnetic field. As a result, the direction of spin of the magnetic film 32 is entirely directed in a constant direction. Of course, not only the reference memory cell but also the magneto-resistive element disposed in the usual memory cell may also include the above-described multi domain.

Figure 5A:
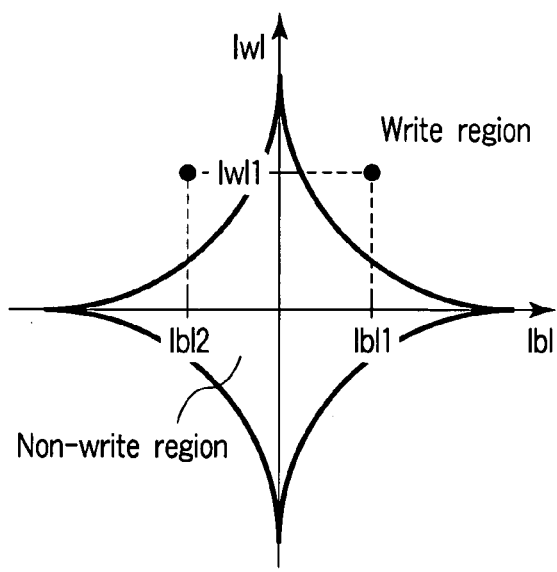
FIG. 5A is a graph showing an asteroid curve of a usual memory cell disposed in the MRAM according to the first embodiment of the present invention.
Figure 5B:
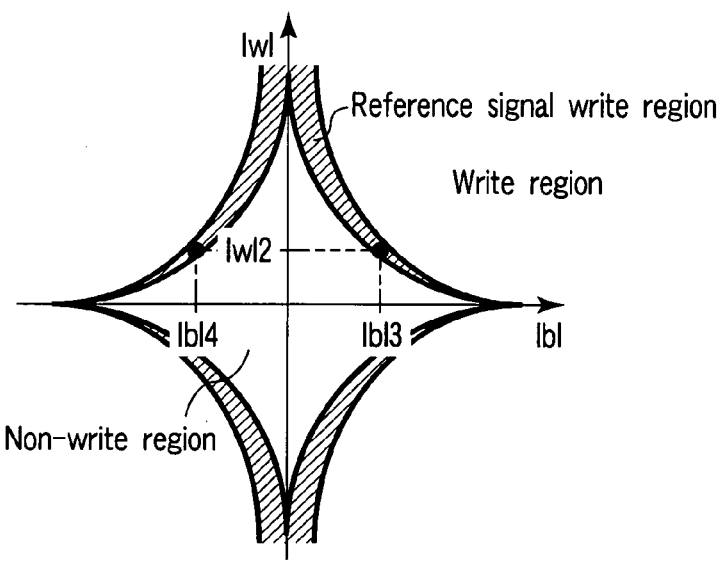
FIG. 5B is a graph showing the asteroid curve of a reference memory cell disposed in the MRAM according to the first embodiment of the present invention.

FIGS. 5A, 5B are graphs (asteroid curves) indicating write threshold values of the usual and reference memory cells. The ordinate indicates a current Iw1 (hard-axis direction magnetic field) flowing through the write word lines WWL1 to WWLm, and the abscissa indicates a current Ib1 (easy-axis direction magnetic field) flowing through the bit lines BL1 to BLn. The asteroid curve is derived from the following Stoner-Wolfarth equation:

$$Hx^{(2/3)}+Hy^{(2/3)}=Hs^{(2/3)}$$

where Hx represents the hard-axis direction magnetic field, Hy represents the easy-axis direction magnetic field, and Hs represents the write threshold magnetic field.

A relation between the currents Iw1, Ib1 for generating the magnetic fields Hx, Hy which satisfy this relation equation is shown in FIGS. 5A, 5B. That is, in the usual memory cell, the respective regions shown in FIG. 5A form write and non-write regions. The write region is a range of a current value in which the direction of spin of the magnetic film 32 can be reversed. The non-write region is a range of the current value in which the direction of the spin of the magnetic film 32 can be retained without being reversed. Therefore, when the data is written in the selected memory cell, a write current needs to be supplied to the write word lines WWL1 to WWLm and bit lines BL1 to BLn so as to satisfy the relation between the currents Iw1 and Ib1 in the write region. On the other hand, when the condition in the non-write region is satisfied in the non-selected memory, wrong writing needs to be prevented.

As shown in FIG. 5B, the asteroid curve in the reference memory cell also has substantially the same shape as that of the usual memory cell. Additionally, in the reference memory cell, a reference signal write region exists between the write and non-write regions. This is a region in which the direction of spin of the magnetic film 32 is not set to be completely parallel or anti-parallel with respect to the magnetic film 30 and the direction of spin can be set to be parallel or anti-parallel only with respect to some of the magnetic domains. Therefore, assuming a state in which the directions of spins of the magnetic films 30, 32 are parallel to each other, when the write currents Iw1 and Ib1 are supplied so as to satisfy the condition in the non-write region, the directions of spins of the magnetic films 30, 32 maintain a mutual parallel state. Moreover, when the write currents Iw1 and Ib1 are supplied so as to satisfy the condition in the write region, the directions of spins of the magnetic film 32 change to a mutual anti-parallel to that of the magnetic film 30. Furthermore, when the write currents Iw1 and Ib1 are supplied so as to satisfy the condition in the reference signal write region, the directions of spins of the magnetic film 32 change to a state in which the directions are not parallel or anti-parallel to that of the film 30.

Figure 6A:
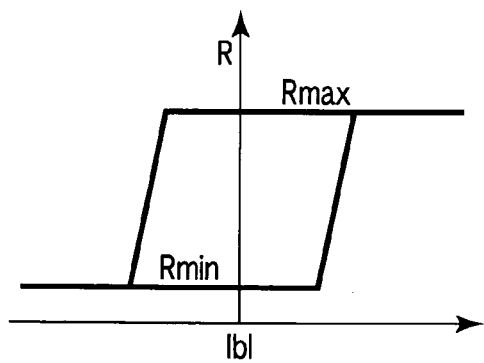
FIG. 6A is a graph showing a relation between a write current and resistance value of the usual memory cell disposed in the MRAM according to the first embodiment of the present invention.
Figure 6B:
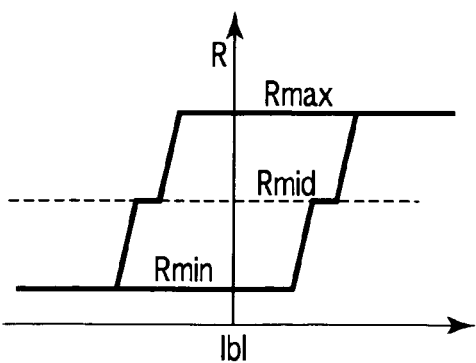
FIG. 6B is a graph showing the relation between the write current and resistance value of the reference memory cell disposed in the MRAM according to the first embodiment of the present invention.

FIGS. 6A, 6B are graphs showing a relation between the write current Ib1 and the resistance value of the magneto-resistive element 21. FIG. 6A shows the graph for the usual memory cell. FIG. 6B shows the graph for the reference memory cell. Note that FIGS. 6A, 6B show how the write data is controlled by the write current passed through the bit lines BL1 to BLn. That is, FIGS. 6A and 6B illustrate the control of write data, which is performed in the case where the bit lines extend the hard-axis direction. The write data may be controlled by the write word lines WWL1 to WWLm, which extend in the hard-axis direction. If this case, it suffices to replace the abscissa with the write current Iw1.

As shown in FIG. 6A, in the usual memory cell, the magneto-resistive element 21 only has two resistance values Rmax, Rmin. As described above, assuming that the directions of spins of the magnetic films 30, 32 have the parallel state, when the write currents Iw1 and Ib1 are supplied so as to satisfy the condition in the non-write region, the directions of spins of the magnetic films 30, 32 maintain the mutual parallel state. Therefore, the magneto-resistive element 21 has the low resistance value Rmin. On the other hand, when the write currents Iw1 and Ib1 are supplied so as to satisfy the condition in the write region, the directions of spins of the magnetic films 30, 32 change to the mutual anti-parallel state. Therefore, the magneto-resistive element 21 has the high resistance value Rmax.

In the reference memory cell, as shown in FIG. 6B, in the same manner as the usual memory cell, the magneto-resistive element 21 has two resistance values Rmax, Rmin, and also has a value Rmid between the resistance values Rmax, Rmin. That is, when the write currents Iw1 and Ib1 are supplied so as to satisfy the condition in the reference signal write region as described above, the directions of spins of the magnetic film 32 change to neither mutual non-parallel nor non-anti-parallel to that of the film 30. In this case, the magneto-resistive element 21 has the intermediate resistance value Rmid, not the high resistance value Rmax or the low resistance value Rmin.

Moreover, the usual memory cell is controlled to have the high resistance value Rmax or the low resistance value Rmin in the write operation of the data. In the reference memory cells MC11 to MCm1 connected to the read word line RWL1, the direction of spin of the magnetic film 32 is fixed to impart the resistance value Rmid to the film 32 beforehand.

Figure 7A:
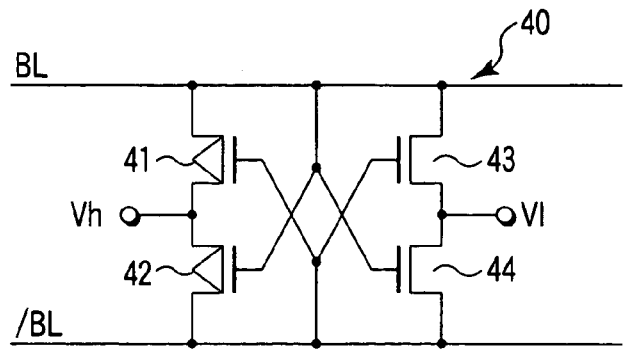
FIG. 7A is a circuit diagram of a sense amplifier disposed in the MRAM according to the first embodiment of the present invention.

Next, the sense amplifier 40 will be described. FIG. 7A is a circuit diagram of the sense amplifier 40. As shown, the sense amplifier 40 is connected to a bit line pair BL, /BL. The bit line pair BL, /BL is connected, for example, to a pair of bit lines BL1 and BL2, a pair of bit lines BL3 and BL3, ... Moreover, the circuit 40 includes p-channel MOS transistors 41, 42 and n-channel MOS transistors 43, 44.

The p-channel MOS transistor 41 includes one end (drain) of the current path connected to the bit line BL, the other end (source) of the current path connected to a high-potential power supply Vh (e.g., VDD), and a gate connected to the bit line /BL. The p-channel MOS transistor 42 includes one end (drain) of the current path connected to the bit line /BL, the other end (source) of the current path connected to the high-potential power supply Vh (e.g., VDD), and the gate connected to the bit line BL. The n-channel MOS transistor 43 includes one end (drain) of the current path connected to the bit line BL, the other end (source) of the current path connected to a low-potential power supply Vl (e.g., VSS), and the gate connected to the bit line /BL. The n-channel MOS transistor 44 includes one end (drain) of the current path connected to the bit line /BL, the other end (source) of the current path connected to the low-potential power supply Vl (e.g., VSS), and the gate connected to the bit line BL.

The sense amplifier 40 detects a potential difference appearing between the bit line pairs, and amplifies the potential difference. As a result, the potentials of the bit lines BL, /BL are raised and lowered to a high-potential power supply voltage Vh and low-potential power supply voltage Vl, respectively.

The column decoders A 50, B 60 decode column address signals inputted from the outside to obtain column address decoded signals. The column address decoded signals obtained by the column decoders A 50, B 60 are supplied to the column driver A/read bias circuit 70 and column driver B 80. It is to be noted that the column decoder B 60 controls a column gate (not shown) at the read operation. The column gate connects any of the bit line pairs of the sense amplifier 40 to a data line pair (DQ, /DQ).

Figure 7B:
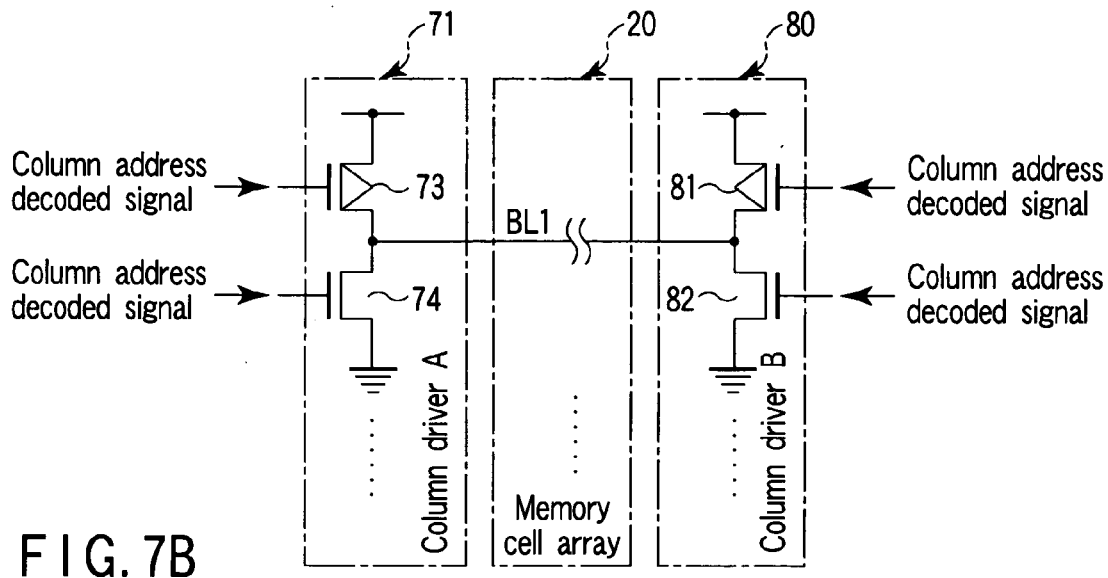
FIG. 7B is a circuit diagram of a column driver disposed in the MRAM according to the first embodiment of the present invention.

Next, the circuit structure of the column driver A/read bias circuit 70 and column driver B 80 will be described. The column driver A/read bias circuit 70 includes a column driver A 71 and read bias circuit 72. FIG. 7B is a circuit diagram especially showing the constitutions of the column driver A 71 and column driver B 80.

As shown, the column driver A 71 includes a pMOS transistor 73 and nMOS transistor 74 disposed for each of bit lines BL1 to BLn. The pMOS transistor 73 includes one end (source) of the current path connected to the power potential, the other end (drain) of the current path connected to any of the bit lines BL1 to BLn, and the gate to which the column address decoded signal is inputted. The nMOS transistor 74 includes one end (source) of the current path connected to the ground potential, the other end (drain) of the current path connected to any of the bit lines BL1 to BLn, and the gate to which the column address decoded signal is inputted.

Moreover, the column driver B 80 includes a pMOS transistor 81 and nMOS transistor 82 disposed for each of bit lines BL1 to BLn. The constitutions of the pMOS transistor 81 and nMOS transistor 82 are similar to those of the pMOS transistor 73 and nMOS transistor 74 in the column driver A 71, and therefore the description thereof is omitted.

The operations of the column drivers A 71 and B 80 are controlled by the column address decoded signal at a write operation. More concretely, by the column address decoded signal, when the pMOS transistor 73 has an on state, the NMOS transistor 74 and pMOS transistor 81 are brought into an off state, and the nMOS transistor 82 is brought into the on state. As a result, the write current Ib1 flowing toward the column driver B 80 from the column driver A 71 is supplied to any of the bit lines BL1 to BLn. Moreover, when the pMOS transistor 81 has the on state, the NMOS transistor 82 and pMOS transistor 73 are brought into the off state, and the nMOS transistor 74 is brought into the on state. As a result, the write current Ib1 flowing toward the column driver A 71 from the column driver B 80 is supplied to any of the bit lines BL1 to BLn. In this manner, when the MOS transistors in the column drivers A 71, B 80 are appropriately controlled by the column address decoded signal, the direction of the write current Ib1 flowing through the bit lines BL1 to BLn can be controlled.

Figure 7C:
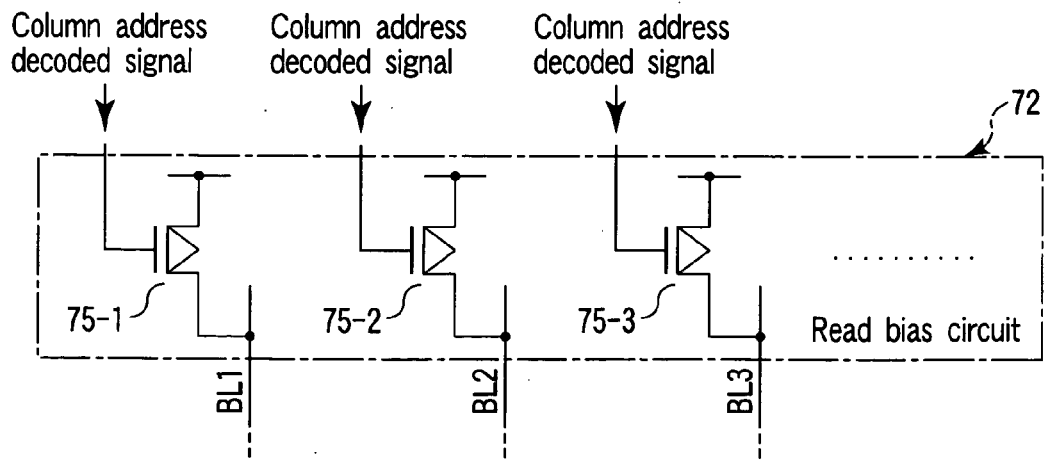
FIG. 7C is a circuit diagram of a read bias circuit disposed in the MRAM according to the first embodiment of the present invention.

Next, the circuit structure of the read bias circuit 72 will be described with reference to FIG. 7C. FIG. 7C is a circuit diagram of the read bias circuit 72.

As shown, the read bias circuit 72 includes p-channel MOS transistors 75-1, 75-2, 75-3, . . . 75-n disposed for the respective bit lines BL1 to BLn. Each of the p-channel MOS transistors 75-1, 75-2, 75-3, . . . 75-n includes one end (source) of the current path connected to the power supply potential, the other end (drain) of the current path connected to any of the bit lines BL1 to BLn, and the gate to which the column address decoded signal is inputted.

The operation of the read bias circuit 72 is controlled by the column address decoded signal at a read operation. Moreover, a read current is supplied to any of the bit lines BL1 to BLn to which the selected memory cell is connected.

The row decoders A 90 and B 100 decode row address signals inputted from the outside to obtain row address decoded signals. The row address decoded signals obtained by the row decoders A 90, B 100 are supplied to the row driver 110 and sinker 120.

Next, the circuit structure of the row driver 110 and sinker 120 will be described. As FIG. 1 shows, the row driver 110 comprises first current sources 111-1 to 111-*m* and second current sources 112-1 to 112-*m*. The first current sources 111-1 to 111-*m* are connected to the write word lines WWL1 to WWLm, respectively. The second current sources 112-1 to 112-*m* are connected to the write word lines WWL1 to WWLm, respectively. The write current supplied to any of the write word lines WWL1 to WWLm from one of the first current sources 111-1 to 111-*m* or one of the second current sources 112-1 to 112-*m* flows into the sinker 120. The first current sources 111-1 to 111-*m* are used to write data into the usual memory cells. The second current sources 112-1 to 112-*m* are used to write data into the reference memory cells.

The row driver 110 includes a voltage source (not shown). The read word lines RWL1 to RWDLM are connected to the voltage source. The voltage source can apply a voltage to the read word lines RWL1 to RWLm.

Figure 7D:
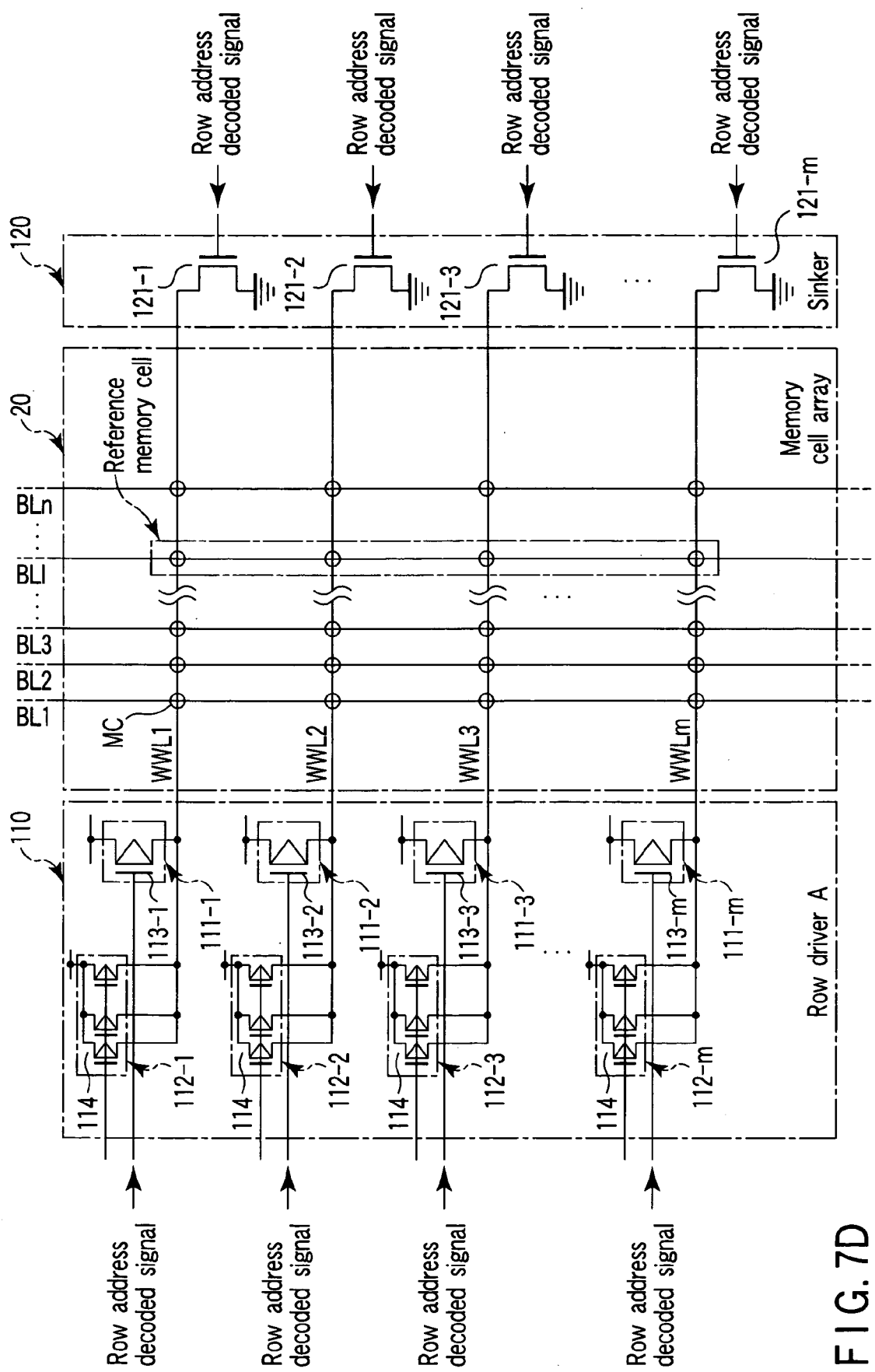
FIG. 7D is a circuit diagram of a row driver and sinker disposed in the MRAM according to the first embodiment of the present invention.

The circuit structure of the row driver 110 and sinker 120 will be described with reference to FIG. 7D. FIG. 7D is a circuit diagram of the row driver 110 and sinker 120.

As FIG. 7D shows, the first current sources 111-1 to 111-*m* in the row driver 110 include p-channel MOS transistors 113-1 to 113-*m*, respectively. Each of the transistors 113-1 to 113-*m* has a current path and a gate. One end (source) of the current path is connected to the power-supply potential, and the other end (drain) of the current path is connected to any of one write word line (WWL1, WWL2, . . . or WWLm). The gate is connected to receive a row address decoded signal.

The second current sources 112-1 to 112-*m* includes p-channel MOPS transistors 114 each. In FIG. 7D, each second current source includes three p-channel MOS transistors 114. The number of p-channel MOS transistor 114 that each second current source has is not limited to three, nonetheless. Each p-channel MOS transistor 114 has a current path and a gate. One end (source) of the current path is connected to the power-supply potential. The other end (drain) of the current path is connected one write word line (WWL1, WWL2, . . . , or WWLm). The gate is connected to receive a row-address decode signal. The second current sourdces 114-1 to 114-*m* supplies a current that is smaller than the current supplied by the first current sources 111-1 to 111-*m*. More precisely, the total current drive capability of the p-channel MOS transistors incorporated in any second current source (112-1, 112-2, . . . or 112-*m*) is smaller than the current drive capability of the p-channel MOS transistor 113 incorporated in any first current source (111-1, 111-2, or 111-*m*). Therefore, the write current Iw1 supplied to the write word lines WWL1 to WWLm by the p-channel MOS transistor 114 is smaller than the write current Iw1 supplied to the write word lines WWL1 to WWLM by the p-channel MOS transistors 113.

That is, the row driver 110 supplies the write current Iw1 fixed to a predetermined value, by using the first current sources 111-1 to 111-*m*. The second current sources 112 to 112-*m*, each including a plurality of MOS transistor 114, can change the write current Iw1.

The sinker 120 includes n-channel MOS transistors 121-1 to 121-*m* disposed for the respective write word lines WWL1 to WWLm. Each of the n-channel MOS transistors 121-1 to 121-*m* includes one end (drain) of the current path connected to each of the write word lines WWL1 to WWLm, the other end (source) of the current path connected to the ground potential, and the gate to which the row address decoded signal is inputted.

In the row driver 110 and sinker 120, a write command may be given to a usual memory cell provided, for example, in the first row of the memory cell array 20. In this case, the p-channel MOS transistor 111-1 included in the first current source 111-1 is turned on, and the n-channel MOS transistor 121-1 included in the sinker 120 is turned on, too. The write current Iw1 therefore flows from the source of the p-channel MOS transistor 111-1 to the source of the n-channel MOS transistor 121-1. As a result, a hard-axis direction magnetic field is generated around the write word line WWL1.

A write command may be given to the reference memory cell MC11 provided in the first row of the memory cell array 20. In this case, at least one of the p-channel MOS transistors 114 included in the second current source 112-1 is turned on, and the n-channel MOS transistor 121-1 incorporated in the sinker 120 is turned on, too. The write current Iw1 therefore flows from the source of the p-channel MOS transistor 114 to the source of the n-channel MOS transistor 121-1. Hence, a hard-axis direction magnetic field is generated around the write word line WWL1.

Next, the operation of the MRAM described above will be described. First, in the write operation to the usual memory cell, an example will be described in writing the data to the usual memory cell MC11 disposed in the intersection of the bit line BL1, and read word line RWL1 and write word line WWL1.

First, in FIG. 1, an address corresponding to the usual memory cell MC11 is inputted from the outside. The row decoders A 90, B 100 decode the row address in the inputted addresses to obtain the row address decoded signals. Moreover, the column decoders A 50, B 60 decode the column addresses to obtain the column address decoded signals.

Based on the row address decoded signal obtained by the row decoder A 90, the first current source 111-1 in the row driver 110 (p-channel MOS transistor 113-1) is turned on (see FIG. 7D). The, the n-channel MOS transistor 121-1 in the sinker 120 is turned on based on the row address decoded signal obtained by the row decoder B 100. Therefore, the write current Iw1 is supplied to the write word line WWL1 from the row driver 110, and this write current Iw1 flows into the sinker 120. As a result, the magnetic field of the hard-axis direction is formed around the write word line WWL1 by the write current Iw1.

Moreover, the p-channel MOS transistor 73 or the n-channel MOS transistor 74, each connected to the bit line BL1 in the column driver A 71, is turned on in response to the column address decoded signal obtained by the column decoder A 50 (see FIG. 7B). Either one of the n-channel MOS transistor 82 and p-channel MOS transistor 81 connected to the bit line BL1 in the column driver B 80 is turned on in response to the column address decoded signal obtained by the column decoder B 60 (see FIG. 7B). When the p-channel MOS transistor 73 is turned on in the column driver A 71 as described above, the n-channel MOS transistor 82 is turned on in the column driver B 80. Then, the write current Ib1 is supplied to the bit line BL1 from the column driver A 71, and the write current Ib1 flows into the column driver B 80. As a result, the magnetic field of the easy-axis direction is formed around the bit line BL1 by the write current Ib1. On the other hand, when the n-channel MOS transistor 74 is turned on in the column driver A 71, the p-channel MOS transistor 81 is turned on in the column driver B 80. Then, the write current Ib1 is supplied to the bit line BL1 from the column driver B 80, and the write current Ib1 flows into the column driver A 71. As a result, the magnetic field of the easy-axis direction is formed around the bit line BL1 by the write current Ib1. At this time, the magnetic field having a direction reverse to that in a case in which the write current Ib1 is supplied to the bit line BL1 from the column driver A 71 is formed. When the direction of the magnetic field formed around the bit line BL1 is controlled by the direction of the write current Ib1 passed through the bit line BL1, the write data is controlled. That is, it is determined whether "0" data or "1" data is written.

The write currents Ib1 and Iw1 supplied by the column driver A 71 or B 80 and row driver 110 are set to satisfy the condition in the write region in the asteroid curve shown in FIG. 5A. That is, when the row driver 110 supplies write current having a magnitude Iw11 to the write word line WWL1, the column driver A 71 supplies the write current having a magnitude Ibl to the bit line BL1. Alternatively, the column driver B 80 supplies the write current having a magnitude Ibl2 to the bit line BL1. It is to be noted that the asteroid curve under an ideal condition is symmetric with respect to an origin, and Ibl1=Ibl2 is established (additionally, the directions are reverse). However, the shape of the asteroid curve, for example, an absolute value or origin position changes with an ambient temperature or the presence of a magnetic domain wall. Therefore, Ibl1≠Ibl2 usually results.

As described above, when the write currents Ib1, Iw1 are supplied to the bit line BL1 and write word line WWL1, magnetic fields having a value not less than a write threshold value (easy-axis direction magnetic field and hard-axis direction magnetic field) are generated around the memory cell MC11. As a result, the direction of spin of the magnetic film 32 is controlled, and the data is written in the memory cell MC11. The memory cell MC11 has the resistance value Rmax ("1" data) or Rmin (11011 data) shown in FIG. 6A in accordance with the written data. It is to be noted that the write currents are not supplied to the bit lines BL2 to BLn and write word lines WWL2 to WWLm. Therefore, the data is not written in the memory cells other than the selected memory cell MC11.

Next, for the write operation to the reference memory cell, an example will be described in a case in which the data is written in the reference memory cell MC11 provided at the intersection of the bit line BL1, read word line RWL1, and write word line WWL1 in FIG. 2. As described above, the reference memory cell does not perform a hold operation of the data, and generates the reference signal used at the read operation. Therefore, the data once written in the reference memory cell is unchanged. Moreover, the data is written in the reference memory cell, for example, at a die sort (D/S: chip selection) test time. Of course, the data may also be written not only at the D/S test time but also at any time before shipment of products, or it is sufficient to write the data before a user actually uses the product.

The address corresponding to the reference memory cell MC11 is inputted from the outside. In accordance with this address, at least one of the p-channel MOS transistors 114 provided in the second current source 112-1 of the row driver 110 is turned on and the n-channel MOS transistor 121-1 incorporated in the sinker 120 is turned on, too (see FIG. 7). Then, the write current Iw1 is supplied to the write word line WWL1 from the row driver A 110, and the write current Iw1 flows into the sinker 120. As a result, the magnetic field of the hard-axis direction is formed around the write word line WWL1 by the write current Iw1. If the second current source 112-1 comprises a plurality of p-channel MOS transistors 114, all transistors 114 need not be turned on. It suffices to turn on only the transistors that can supply the predetermined write current.

Either the p-channel MOS transistor 73 or the n-channel MOS transistor 74, which is connected to the bit line BL1, is turned on in the column driver A 71 (see FIG. 7B). Either one of the n-channel MOS transistor 82 and p-channel MOS transistor 81 connected to the bit line BL1 is turned on in the column driver B 80. Then, the column driver A 71 or column driver B 80 supplies the write current Ib1 to the bit line BL1. As a result, the magnetic field of the easy-axis direction is formed around the bit line BL1 by the write current Ib1.

The write currents Ib1 and Iw1 supplied by the column driver A 71 or B 80 and row driver 110 are set so as to satisfy the condition in the reference signal write region in the asteroid curve shown in FIG. 5B. That is, when the row driver 110 supplies the write current having a magnitude Iwl2 to the write word line WWL1, the column driver A 71 supplies the write current having a magnitude Ibl3 to the bit line BL1. Alternatively, the column driver B 60 supplies the write current having a magnitude Ibl4 to the bit line BL1. As shown in FIG. 5B, at this current value, the synthesized magnetic field of the hard-axis direction magnetic field and easy-axis direction magnetic field is set to the vicinity of the write threshold value. In other words, the region is not a complete write region, or complete non-write region. When the writing is performed by the write currents Ib1, Iw1 having such value, the resistance value of the magneto-resistive element 21 of the reference memory cell MC1l is Rmid between Rmax and Rmin shown in FIG. 6B.

Note that the resistance value of the magneto-resistive element 21 can also be set by either the write current Ib1 or Iw1 flowing through the bit line and write word line. In the MRAM according to the present embodiment, the row driver A 110 comprises second current sources 112-1 to 112-*m* in addition to the first current sources 111-1 to 111-*m*. The second current sources 112-1 to 112-*m* have smaller current drive capability than the first current sources 111-1 to 111-*m*. The second current sources 112-1 to 112-*m* are used to write data into the reference memory cells. Therefore, the resistance value of the magneto-resistive element 21 can be controlled by the write current Iw1 passed through the write word line WWL1. More precisely, the write currents Iw1 and Ib1 can be set as follows. First, the write current Ib1 is supplied to the bit line BL1 in the same manner as in writing the data in the usual memory cell. This write current has value Ibl3 (=Ibl1). The number of p-channel MOS transistors 114 that should be turned on in the second current sources 112-1 to 112-*m* is controlled in this state, thereby setting the write current Iw1, which is to be supplied through the write word line WWL1, to Iwl2 that is smaller than Iwl1. As a result, the synthesized magnetic field of the hard-axis direction magnetic field and easy-axis direction magnetic field can be set within the reference signal write region.

The above-described process is performed with respect to all the memory cells MC1l to MCln. Additionally, the size of the asteroid curve needs to be prevented from remarkably differing between the usual memory cell and reference memory cell. This prevents the reference memory cell from being disturbed and prevents the resistance value from changing at the write time to the usual memory cell.

Figure 8:
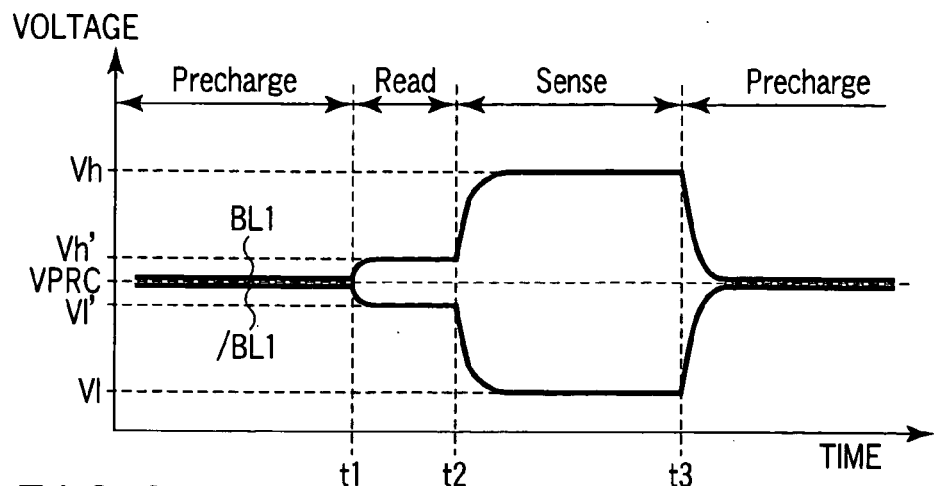
FIG. 8 is a waveform diagram showing a voltage change of a bit line pair at a read operation of the MRAM according to the first embodiment of the present invention.

An operation of reading data from the memory cell MC11 will be described with reference to FIG. 8. FIG. 8 is a waveform diagram that shows the voltage applied to the bit line pair to read data from the memory cell MC11.

To read data from the cell MC11, the selection transistors 22 of the usual memory cell MC11 and reference memory cell MC1l are turned on, and the read currents are supplied to the bit lines BL1 and BL1 from the read bias circuit 72. Then, the voltage on the bit lines BL1 and BL2 are compared with each other, thereby identifying the data written in the memory cell MC11, as will be described hereinafter in detail.

At first, the sense amplifier 40 is disconnected from the data line pair DQ, /DQ by a column gate (not shown). In this state, the sense amplifier 40 is brought in a non-active state, and the bit line is precharged. As a result, the potential of the bit line pair BL, /BL (BL1, BL2, BL3, BL4, . . . ) is set to a precharge level VPRC. The precharge level VPRC is, for example, VDD/2. Thereafter, the bit line precharge ends. Accordingly, the potential of the bit line pair BL, /BL is floating at the precharge level VPRC.

Next, the address corresponding to the usual memory cell MC11 is inputted from the outside. In this case, the address corresponding to the reference memory cell MC1l is also inputted. The row decoders A 90, B 100 decode the row addresses in the inputted addresses to obtain the row address decoded signals. The column decoders A 50, B 60 decode the column addresses to obtain the column address decoded signals.

Subsequently, the read word line RWL1 is set to high level. Accordingly, the selection transistors 22 of the memory cells MC11 and MC1l are turned on.

The p-channel MOS transistors 75-1 and 75-1 connected to the bit lines BL1 and BL1, respectively, in the read bias circuit 72 are turned on in response to the column address decoded signal obtained by the column decoder A 50 (see FIG. 7C). Therefore, the read bias circuit 72 supplies read currents Ib1' to the bit lines BL1 and BL1.

When the selection transistors 22 are turned on, and the read currents Ib1' are supplied to the bit lines BL1 and BL1, the data is read from the usual memory cell MC11 and reference memory cell MC1l (FIG. 8, time t1). That is, when the current flows through the magneto-resistive elements 21 of the respective memory cells MC11 and MC1l, the voltages corresponding to the resistance values of the magneto-resistive elements 21 appear in the bit lines BL1 and BL1.

When the data written in the usual memory cell MC11 is "1" data, that is, the magneto-resistive element 21 may have high resistance (Rmax). In this case, the potential of the bit line BL1 rises from the precharge level VPRC, by a voltage (+ΔV) corresponding to the resistance value, to a potential Vh' as shown in FIG. 8. Conversely, the potential of the bit line BL1 connected to the reference memory cell MC1l drops from the precharge level VPRC, by the voltage (−ΔV) corresponding to the resistance value, to Vl' (time t1 to t2).

Subsequently, the sense amplifier 40 is activated (time t2). The activated sense amplifier 40 detects the potential difference appearing between the bit line pairs, and amplifies the potential difference. Accordingly, the bit lines BL, /BL of the sense amplifier 40 rise to Vh, Vl, respectively. The data of the usual memory cell MC11 is identified by the potential difference between the bit line pairs. It is to be noted that when the sense amplifier 40 is activated, the column decoder B 60 controls the column gate (not shown), and connects the bit line pair BL, BL to the data line pair DQ, /DQ. Subsequently, in response to an output enable signal inputted from the outside, the read data appearing in the data line pair is outputted as output data Dout via the output buffer 130.

Thereafter, the bit lines BL1, BL1, . . . are set again to the precharge level VPRC.

According to the semiconductor memory device described above, since it is easy to prepare the reference signal required at the read operation, and the reference signal can be prepared with good precision, the reliability of the read operation can be enhanced. This is because the magneto-resistive element having three values (or more values) is used to prepare the reference signal. That is, the usual memory cell for storing the data can take two states (two values) including the high resistance ("1") and low resistance ("0"). On the other hand, the reference memory cell for preparing the reference signal can take a state between the states of the high resistance ("1") and low resistance ("0") in the usual memory cell. It is assumed that this state is referred to as "10". That is, three values can be taken. Furthermore, "10" having the resistance value between "1" and "0" is written in the reference memory cell. Additionally, the difference between the "1" or "0" data read from the usual memory cell and the "10" data read from the reference memory cell is amplified by the sense amplifier.

To write the "10" data in the magneto-resistive element, the current drive capability of the row decoder is set to be variable. Furthermore, when the write current passed through the write word line is adjusted, the "10" data can be written in the magneto-resistive element with good precision.

As a result, the reference memory cells only for one row in the memory cell array may be disposed, and scalability is very superior. Therefore, the present embodiment can easily be applied also to the memory cell array which has a large capacity. Moreover, since the reference signal can be prepared by adjusting the supplied current by the row driver, the precision does not depend on manufacturing dispersion, and the reference signal is very superior in precision. Furthermore, it is very simple and easy to prepare the reference signal. As a result, a semiconductor memory device can be realized in which the reliability of the read operation can be enhanced without increasing the area.

Figure 9:
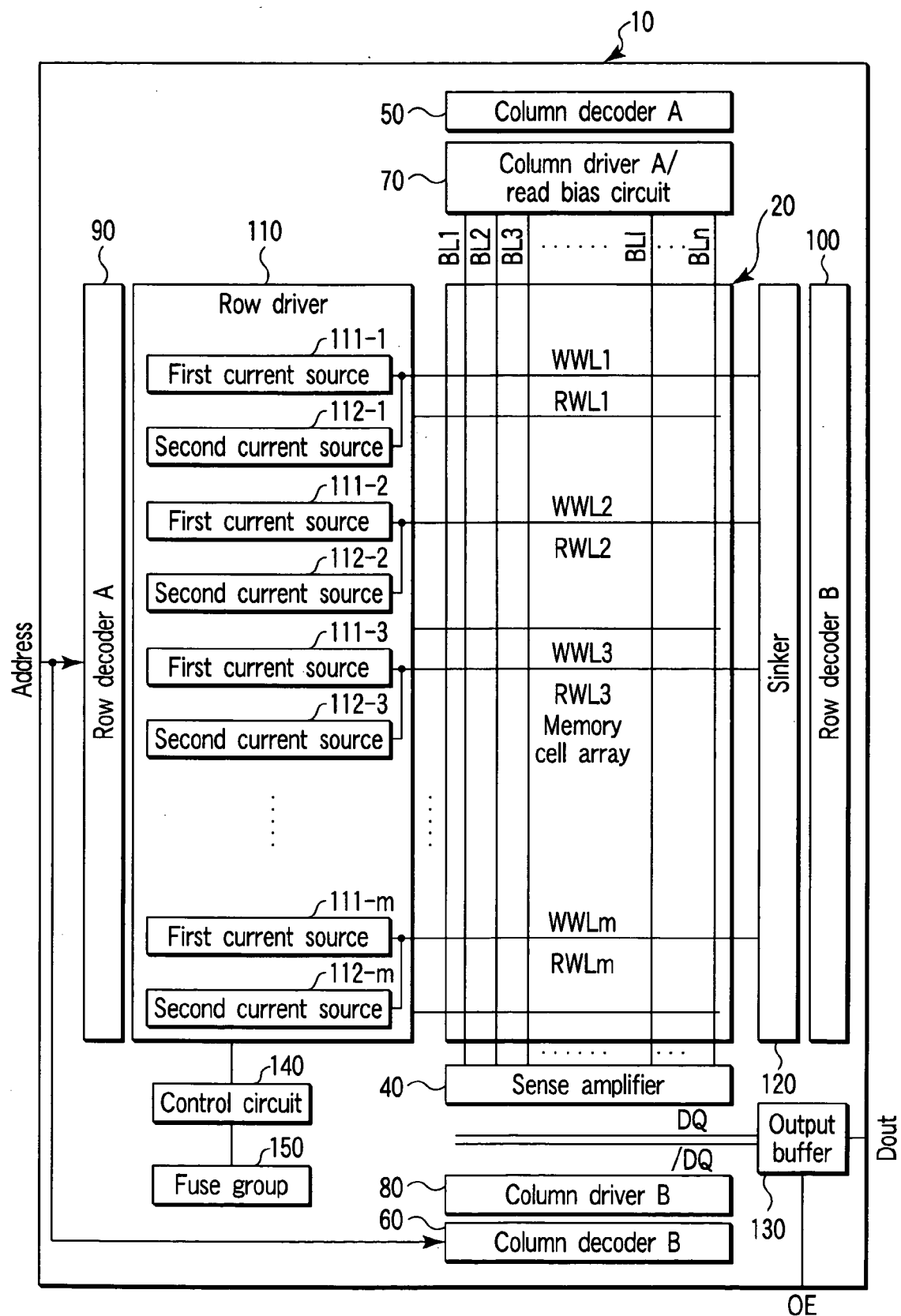
FIG. 9 is a block diagram of the MRAM according to a second embodiment of the present invention.

The semiconductor memory device according to a second embodiment of the invention will be described with reference to FIG. 9. FIG. 9 is a block diagram of the MRAM according to the present embodiment.

As FIG. 9 shows, this MRAM is identical to the first embodiment illustrated in FIG. 1, except that it comprises a control circuit 140 and fuse group 150. The components other than the circuit 140 and fuse group 150 will not described.

Figure 10:
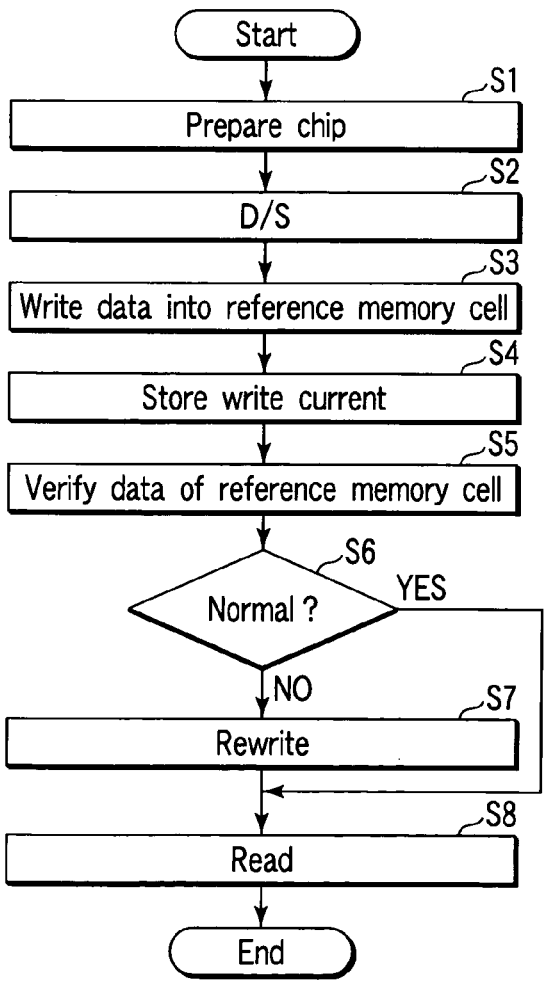
FIG. 10 is a flowchart showing a control method of the MRAM according to the second embodiment of the present invention.

The control circuit 140 and fuse group 150 will be described, together with a method of generating reference signals, with reference to FIG. 10. FIG. 10 is a flowchart explaining the method of generating reference signals.

First, a semiconductor chip has been manufactured (step S1), the die sort test (step S2) is performed. At the die sort time, as described above in the first embodiment, the data is written in the reference memory cells MC11 to MCm1 (step S3). That is, the method comprises: adjusting the value of the write current Iw1 supplied to the write word line WWL1 by the second current source 112 in the row driver A 110 (see FIG. 7D); and setting the resistance of the magneto-resistive element 21 of the reference memory cells MC11 to MCm1, to Rmid (see FIG. 6B). In this case, the write current Iw1 supplied to the write word line WWL1 can be determined by the number of p-channel MOS transistors to be turned on in the second current source 112.

Then, at the die sort test time, the control circuit 140 stores information indicating the p-channel MOS transistor 114 which has been turned on in the fuse group (step S4). More concretely, when the fuses connected to the gate of each MOS transistor 114 is disconnected, the information is stored. That is, the information of the write current Iw1 by which the resistance value of the magneto-resistive element of the reference memory cell can be set to Rmid can be stored in the fuse group 150.

Thereafter, after performing various tests, the products are shipped.

After the shipping, the control circuit 140 verifies whether the data written in the reference memory cells MC11 to MCm1 is normal, before the user performs the read operation after performing several write operations (step S5). This is because during the writing into the usual memory cell, disturbance occurs with respect to the reference memory cell, and the resistance value sometimes changes from Rmid.

As a result of the verification, when the resistance value of the magneto-resistive element of the reference memory cell maintains Rmid (step S6), the read operation is successively performed (step S8).

As a result of the verification, when the resistance value of the magneto-resistive element of the reference memory cell does not maintain Rmid (step S6) and, for example, when the value changes to the high resistance value Rmax or low resistance value Rmin, the data is rewritten into the reference memory cell before read out. That is, the control circuit 140 reads the information stored in the fuse group 150. As described above, the information relates to the write current Iw1 by which the resistance value of the magneto-resistive element of the reference memory cell can be set to Rmid. More concretely, the information is the number of p-channel MOS transistors 114 to be turned on at the write time into the reference memory cell. The row driver 110 rewrites the data into the reference memory cell, and again sets the resistance value of the magneto-resistive element of the reference memory cell to Rmid again. Thereafter, the read operation is performed (step S8).

The semiconductor memory device described above can achieve effect similar to those the first embodiment attains. Furthermore, as compared with the first embodiment, the reliability of the read operation can further be enhanced. This is because the magneto-resistive element having three values (or more values) is used in the reference memory cell for generating the reference signal. Moreover, the information of the write current by which the magneto-resistive element can take the state "10" is held in the fuse group. According to the present embodiment, even after the shipping, it is possible to appropriately set the resistance value of the magneto-resistive element of the reference memory cell to a correct value again. Therefore, it is constantly possible to obtain the correct reference signal.

Figure 12:
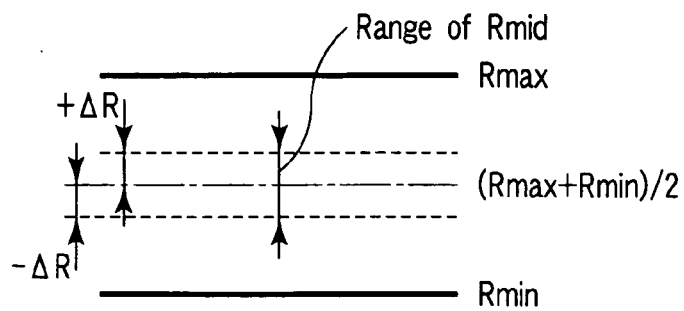
FIG. 12 is a diagram showing the resistance value of the MRAM memory cell according to the third embodiment of the present invention.

The semiconductor memory device according to a third embodiment of the present invention will be described. The third embodiment relates to a method of correcting deviation of the resistance value of the reference memory cell from Rmid in the first embodiment. It is to be noted that the resistance value Rmid to be indicated by the reference memory cell is defined as shown in FIG. 12. That is, the resistance value of the memory cell which holds the "1" data is Rmax, and the resistance value of the memory cell which holds the "0" data is Rmin. Moreover, since the resistance value Rmid to be taken by the reference memory cell is a resistance value in a range of ±ΔR from an intermediate resistance (Rmax+Rmin)/2 between Rmax and Rmin. When the reference memory cell has the resistance in this range, the reference signal having a sufficiently good precision is obtained.

Figure 11:
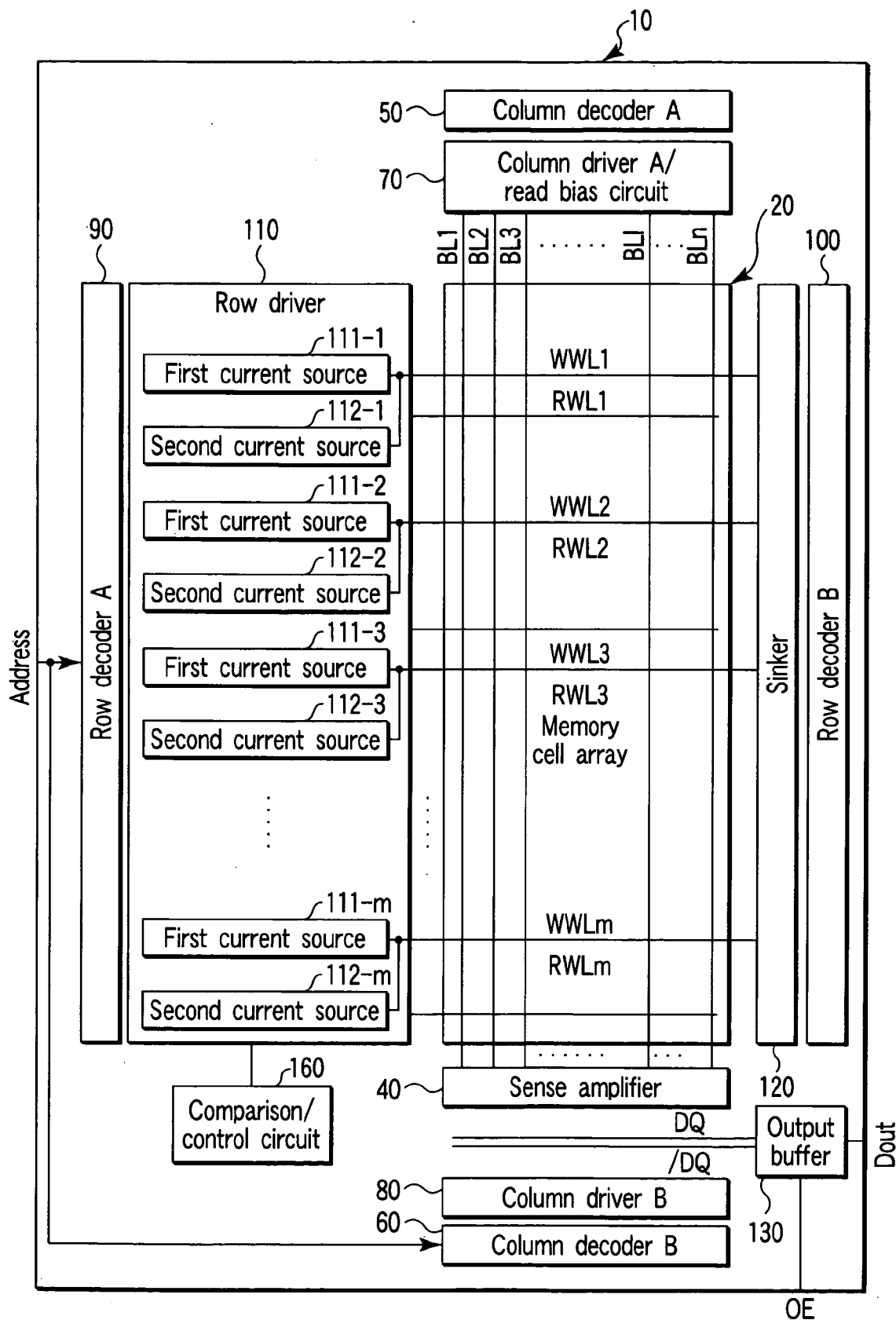
FIG. 11 is a block diagram of the MRAM according to a third embodiment of the present invention.

FIG. 11 is a block diagram of the MRAM according to the present embodiment.

As shown, the MRAM according to the present embodiment includes a comparison/control circuit 160 in the configuration described above in the first embodiment with reference to FIG. 1. Since the configuration other than the comparison/control circuit 160 is similar to that of the first embodiment, the description thereof is omitted.

Figure 13:
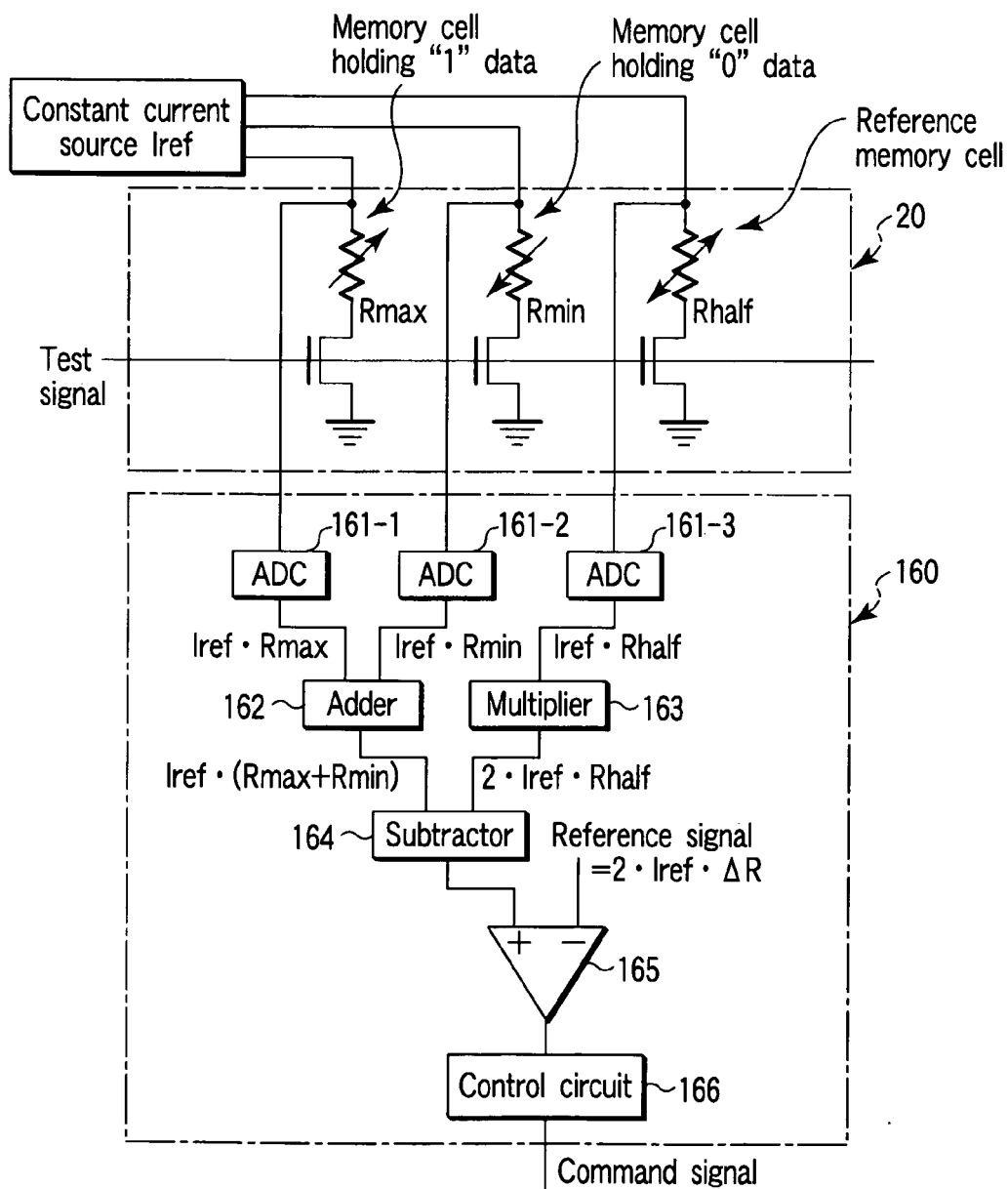
FIG. 13 is a circuit diagram of a part of the memory cell array disposed in the MRAM according to the third embodiment of the present invention, and comparison/control circuit.

The comparison/control circuit 160 will be described with reference to FIG. 13. FIG. 13 is a circuit diagram (block diagram) of a part of the memory cell array 29 and the comparison/control circuit 160.

The comparison/control circuit 160 monitors the resistance value of the reference memory cell. Moreover, the circuit 160 has a function of instructing the rewriting into the reference memory cell, when the resistance value of the reference memory cell deviates from (Rmax+Rmin)/2 by ±ΔR or more. Concretely, as shown in FIG. 13, the comparison/control circuit 160 includes A/D converters 161-1 to 161-3, and an adder 162, multiplier 163, subtractor 164, comparator 165, and control circuit 166.

The A/D converters 161-1 to 161-3 convert the data read from the memory cell holding "1" data, memory cell holding the "0" data, and reference memory cell into digital values. The adder 162 adds the outputs of the A/D converters 161-1, 161-2. The multiplier 163 multiplies the output of the A/D converter 161-3. The subtractor 164 calculates a difference between the outputs of the adder 162 and multiplier 163. Moreover, the comparator 165 compares the output of the subtractor 164 with a base signal. The base signal will be described later. The control circuit 166 controls the row driver 110 based on the comparison result in the comparator 165.

The operation of the comparison/control circuit 160 will be described, together with a method of generating reference signals, with reference to FIGS. 13 and 14. FIG. 14 is a flowchart showing the method of generating reference signals.

First, the data is written in the reference memory cell by the method described above in the first and second embodiments (step S11). Of course, the write operation is performed in order to set a resistance value Rhalf of the reference memory cell to the value Rmid.

Next, it is verified whether or not the resistance value Rhalf of the reference memory cell is Rmid. If the value is not Rmid, the data is rewritten into the reference memory cell. In this case, not only the reference memory cell but also the memory cell holding the "1" data and the memory cell holding the "0" data are used. For the memory cell which holds the "1" and "0" data for use herein, the memory cell for memorizing the data in the memory cell array may also be used, or an exclusive-use memory cell may also be prepared. First, in step S12 in FIG. 14, the data is read from the memory cell holding the "1" data, the memory cell holding the "0" data, and the reference memory cell. That is, the selection transistors of each memory cell and reference memory cell are turned on, and a current Iref is supplied to the bit line from a constant-current source. The constant-current source is, for example, a read bias circuit 70 in FIG. 11. The read data is converted to the digital value by each of the A/D converters 161-1 to 161-3. More concretely, the A/D converter 161-1 outputs (Iref·Rmax), the A/D converter 161-2 outputs (Iref·Rmin), and the A/D converter 161-3 outputs (Iref·Rhalf) in the digital values.

In the step S13 shown in FIG. 14, the adder 162 adds the data outputted from the A/D converter 161-1 and the data outputted from the A/D converter 161-2. Therefore, the adder 162 outputs Iref·(Rmax+Rmin). The multiplier 163 multiplies the data outputted from the A/D converter 161-3. Therefore, the multiplier 163 outputs 2·Iref·Rhalf.

Next, the subtractor 164 calculates the difference between the outputs of the adder 162 and multiplier 163 (step S14). Therefore, the subtractor 164 outputs Iref·(Rmax+Rmin−2Rhalf). This calculation result is a value twice that of the voltage corresponding the deviation, when Rhalf deviates from (Rmax+Rmin)/2.

The comparator 165 compares the calculation result in the subtractor 164 with that in the multiplier 163 (step S15). The base signal indicates a voltage of 2·Iref·ΔR, and this is a value twice that of the voltage corresponding to the resistance value ΔR. When the absolute value of the calculation result in the subtractor 164 is smaller than the base signal (step S16), a deviation amount from (Rmax+Rmin)/2 of the resistance value Rhalf of the reference memory cell is zero or ΔR or less. Therefore, a relation of Rhalf=Rmid is satisfied, and the reference memory cell obtains the reference signal with the sufficiently good precision. Therefore, the process ends. Conversely, when the absolute value of the calculation result in the subtractor 164 is larger than the base signal (step S16), the deviation amount from (Rmax+Rmin)/2 of the resistance value Rhalf of the reference memory cell is larger than ΔR. That is, the resistance value Rhalf of the reference memory cell is not in the range of Rmid. In this case, the reference signal obtained from the reference memory cell is excessively larger or smaller than an ideal value. Therefore, the writing into the reference memory cell is repeated again (returning to step S11). To perform the rewriting, based on the information indicating whether the reference memory cell Rhalf is excessively large or small, the control circuit 166 controls the row driver 110. By a command signal outputted from the control circuit 166, the row driver 110 sets the write current to be larger or smaller than that at the previous write time, and the resistance value of the reference memory cell is set to Rmid.

The semiconductor memory device described above attains effects similar to those the first embodiment achieves. Further, the reference signal can have higher precision than in the first embodiment. This is because the magneto-resistive element having three values (or more values) is used in the reference memory cell for preparing the reference signal. Subsequently, in the writing into the reference memory cell, the resistance value of the magneto-resistive element is compared with Rmid, and the comparison result is fed back to the row driver. Therefore, for example, even when the characteristic of the reference memory cell changes, and the resistance value Rmid cannot be realized by the first write current, the comparator compares the existing resistance value with Rmid to perform the write operation. Accordingly, the resistance value of the magneto-resistive element can correctly be set to Rmid. It is to be noted that the process shown in FIG. 14 may also be performed every read time of the data or every elapse of a certain predetermined period.

As described above, according to the semiconductor memory device of the first to third embodiments of the present invention, the magneto-resistive element having three resistance values are used in the reference memory cell. These three resistance values are two resistance values of the usual memory cell, and the intermediate value. The magneto-resistive element of the reference memory cell has the intermediate resistance value. Subsequently, the difference between the data read from the usual memory cell and the data read from the reference memory cell is amplified by the sense amplifier. The resistance value of the magneto-resistive element of the reference memory cell is controlled by adjusting the write current.

Therefore, it is simple and easy to prepare the reference signal, and the reference signal can be prepared with good precision. As a result, the reliability of the read operation in the MRAM can be enhanced. Moreover, it is sufficient to dispose the reference memory cells for one column in the memory cell array. Therefore, an area increase by the disposed reference memory cell can be minimized.

FIG. 15 is a block diagram of the MRAM according to a modification example of the first to third embodiments. In the above-described embodiments, the writing into the reference signal is controlled by the row driver. On the other hand, in the present modification example, the writing is controlled by the column driver.

As FIG. 15 shows, the row driver 110 of the MRAM according to this modification example has first current sources 111-1 to 111-m, but does not have second current sources as the first to third embodiments. The first current sources 111-1 to 111-$m$ have the same current drive capability. Note that the memory cell connected to the bit line BL1 functions as reference memory cell. The column driver B 80 comprises first current sources 83-1 to 83-(1-1), 83-(1+1) to 83-$n$ and second current source 84. The first current sources 83-1 to 83-(1-1), 83-(1+1) to 83-$n$ are connected to the bit lines BL1 to BL-(1-1), BL(1+1) to BLn. The second current source 84 is connected to the bit line BL1.

Figure 16:
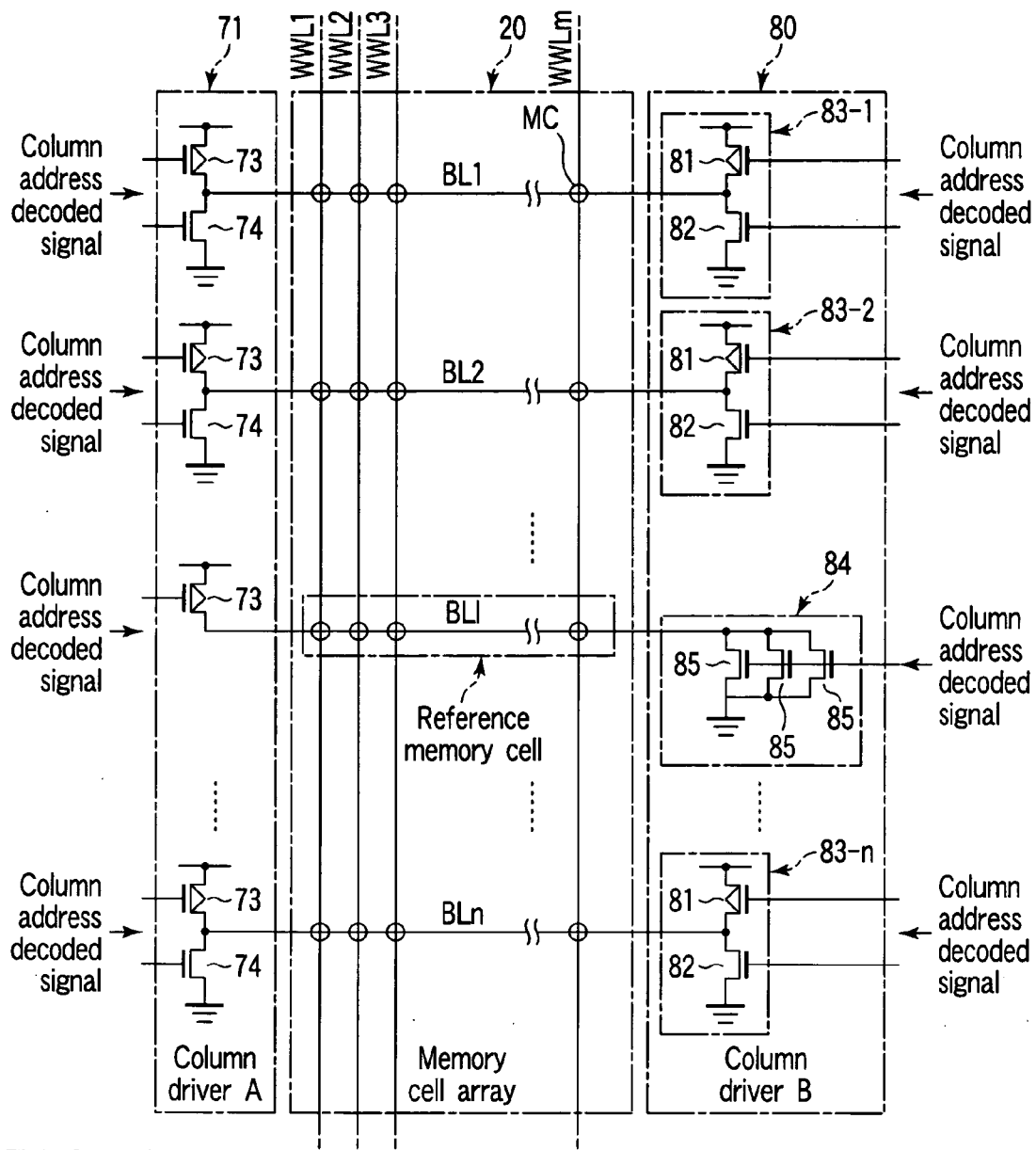
FIG. 16 is a circuit diagram of a column driver disposed in the MRAM according to the modification example of the first to third embodiments of the present invention.

FIG. 16 is a circuit diagram of the column driver B 80 and column driver A 71. As FIG. 16 depicts, the first current sources 83-1 to 83-(1-1), 83-(1+1) to 83-$n$ include the p-channel MOS transistor 81 and n-channel MOS transistor 82 described in the first embodiment. The second current source 84-1 includes an n-channel MOS transistor 85 including one end (source) of the current path connected to the ground potential, the other end (drain) of the current path connected to the bit lines BL1 to BLn, and the gate to which the column address decoded signal is inputted. FIG. 16 shows three n-channel MOS transistors 85. Nonetheless, the number of n-channel MOS transistors 85 used is not limited to three.

In the present modificatlion example, the column driver B 80 can adjust the value of the write current Ib1 to be supplied to the bit line BL1. More precisely, the write current Ib1 to be supplied to the bit line BL1 can be controlled in accordance with how many n-channel MOS transistors 85 included in the second current source 84 should be turned on. Therefore, the resistance value of the magneto-resistive element of the reference memory cell can be set to Rmid, and the effect similar to that of the first to third embodiments can be obtained. In the example of FIGS. 15 and 16, the second current source 84 is provided in the column driver B 80 only.

Nonetheless, the second current source 84 may be provided also in the column driver A 71, or also in both the column drivers A 71 and B 80. The second current source 84 may include the p-channel MOS transistor instead of the n-channel MOS transistor.

It is to be noted that in the first to third embodiments the bit lines BL1 to BLn are formed along the hard-axis direction, and the write word lines WWL1 to WWLm are formed along the easy-axis direction as described above. Therefore, the data written in the usual memory cell is controlled by the direction of the current flowing through the bit lines BL1 to BLn. However, the bit lines BL1 to BLn may be formed along the easy-axis direction, and the write word lines WWL1 to WWLm may also be formed along the hard-axis direction. In this case, the data written in the memory cell is controlled by the direction of the current flowing through the write word lines WWL1 to WWLm.

In the first to third embodiments, a case has been described in which an ideal asteroid curve is obtained with respect to the write threshold value of the magneto-resistive element. However, the magneto-resistive element undergoes disturbances of the magnetic domain wall, anisotropic dispersion, edge domain, and ambient temperature in a magnetization reverse process. As a result, the threshold value curve usually deviates from the ideal asteroid curve. The above-described embodiments can be applied even to this case.

In the first to third embodiments, the reference memory cell is arranged in a middle portion of the memory cell array as shown in, for example, FIG. 1. Of course, the reference memory cell may also be positioned in the middle of the memory cell array or a memory cell sub-array, but the position of the cell is not especially limited. For example, the cell may also be positioned in the end of the array.

In the first to third embodiments, the usual memory cell has the asteroid curve shown in FIG. 5A and the resistance value shown in FIG. 6A. The reference memory cell has the asteroid curve shown in FIG. 5B and the resistance value shown in FIG. 6B as described above. However, the usual memory cell may also have the same characteristic as that of the reference memory cell. That is, the usual memory cell may also have not only the resistance values Rmax and Rmin but also the resistance value Rmid. Needless to say, the data is written into the usual memory cell so as to indicate either value of Rmax and Rmin. In this case, the manufacturing process can be simplified because the similar structure can be used between the usual memory cell and reference memory cell. This contributes to the reduction of manufacturing cost.

Figure 17:
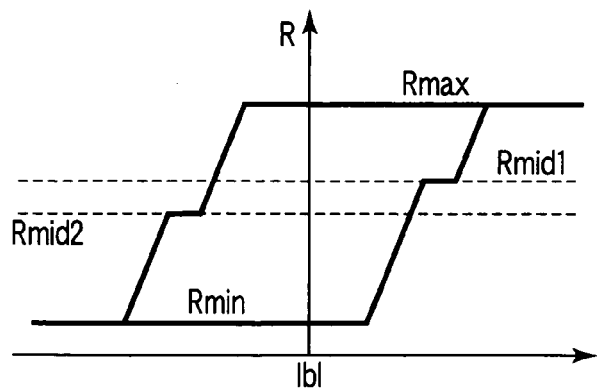
FIG. 17 is a graph showing the relation between the write current and resistance value of the reference memory cell disposed in the MRAM according to the modification example of the first to third embodiments of the present invention.
Figure 18:
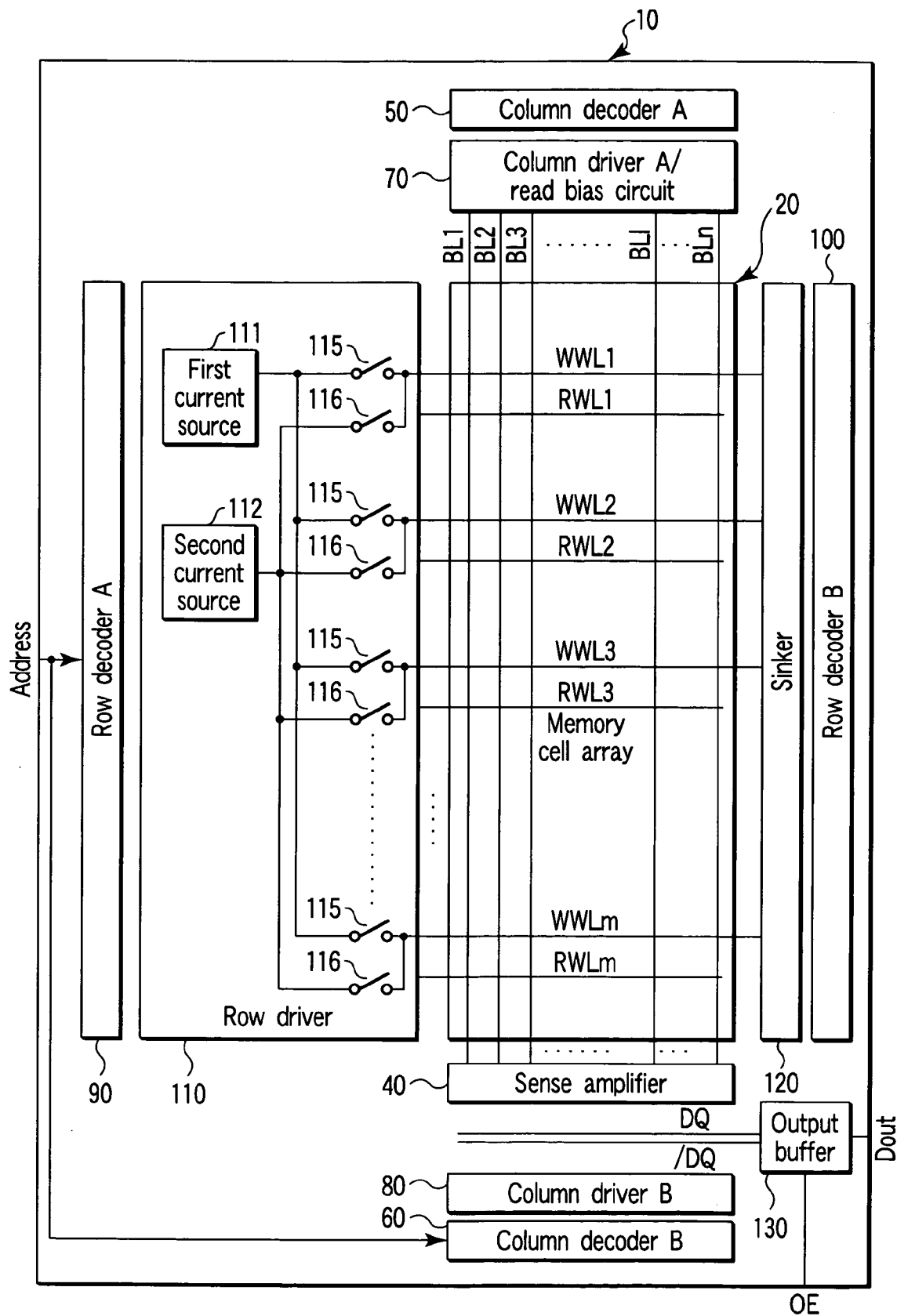
FIG. 18 is a block diagram illustrating an MRAM according to a modification of the first to third embodiments of the invention.

Moreover, the number of values that the reference memory cell can have is not limited to three. The reference memory cell can have three or more values. For example, as shown in FIG. 17, two different resistance values Rmid1, Rmid2 may also be disposed between Rmax and Rmin. Of course, the number of values may be greater than four.

In the first to third embodiments, the first and second current sources are provided for each word line. Nevertheless, each row driver 110 may have one first current source 111 and one second current source 112. If this is the case, a switch 115 connects the first current source 111 to the write word lines WWL1 to WWLm, and a switch 116 connects the second current source 112 to the write word lines WWL1 to WWLm.

In the first to third embodiments, the MTJ element used as the magneto-resistive element may be replaced by, for example, a giant magneto-resistive (GMR) element or a colossal magneto-resistive (CMR) element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor memory device comprising:
   a plurality of word lines formed along a first direction;
   a plurality of bit lines formed along a second direction crossing at right angles to the first direction;
   a first memory cell including a magneto-resistive element which has either a first resistance or a second resistance smaller than the first resistance;
   a second memory cell including a magneto-resistive element which has a resistance between the first and second resistances;
   a memory cell array including the first and second memory cells disposed at intersections of a word line and bit lines;
   a row decoder which selects the word line;

a row driver including a first current source configured to supply a first write current to the word line selected by the row decoder and a second current source configured to supply a second write current to the word line selected by the row decoder, an absolute value of the second write current being smaller than that of the first write current, the first current source supplying the first write current to the word line such that the magneto-resistive element of the first memory cell has either the first or second resistance to perform a write operation, and the second current source supplying the second write current to the word line such that the magneto-resistive element of the second memory cell has a resistance between the first and second resistances;

a column decoder which selects a bit line;

a column driver which supplies a third write current to the bit line selected by the column decoder; and a sense amplifier which amplifies data read from the first memory cell selected by the row decoder and column decoder.

2. The device according to claim 1, further comprising: a hold circuit which holds the value of the second write current required to set the resistance of the magneto-resistive element of the second memory cell to a value between the first and second resistances.

3. The device according to claim 1, wherein the second memory cells are arranged at the intersection of any one bit line and word lines.

4. The device according to claim 1, wherein the sense amplifier amplifies the data read from the first memory cell based on the data held by the second memory cell.

5. The device according to claim 4, wherein the sense amplifier identifies the data read from the first memory cell by a magnitude with respect to the data read from the second memory cell.

6. The device according to claim 1, further comprising:
a judgment circuit to judge whether or not the resistance of the magneto-resistive element of the second memory cell is in a predetermined range between the first and second resistances; and a control circuit to command the rewriting of the data with respect to the second memory cell, when the resistance of the magneto-resistive element of the second memory cell is not in a predetermined range as a result of judgment in the judgment circuit.

7. The device according to claim 6, wherein the control circuit controls the value of the current supplied by either one of the row driver and column driver in accordance with a judgment result in the judgment circuit in commanding the rewriting.

8. A semiconductor device comprising:
a plurality of word lines formed along a first direction;
a plurality of bit lines formed along a second direction crossing at right angles to the first direction;
a first memory cell including a magneto-resistive element which has either a first resistance or a second resistance smaller than the first resistance;
a second memory cell including a magneto-resistive element which has a resistance between the first and second resistances;
a memory cell array including the first and second memory cells disposed at intersections of a word line and bit lines;
a row decoder which selects the word line;
a row driver configured to supply a first write current to the word line selected by the row decoder;
a column decoder configured to select a bit line;

a column driver including a first current source which supplies a second write current to the bit line such that the magneto-resistive element of the first memory cell has either the first or second resistances to perform a write operation and a second current source which supplies a third write current to the bit line such that the magneto-resistive element of the second memory cell has a resistance between the first and second resistances, an absolute value of the third write current being smaller than that of the second write current; and a sense amplifier configured to amplify data read from the first memory cell selected by the row decoder and column decoder.

9. The device according to claim 8, further comprising:
a hold circuit which holds the value of the third write current required to set the resistance of the magneto-resistive element of the second memory cell to a value between the first and second resistances.

10. The device according to claim 8, wherein the second memory cells are arranged at the intersection of any one bit line and word lines.

11. The device according to claim 8, wherein the sense amplifier amplifies the data read from the first memory cell based on the data held by the second memory cell.

12. The device according to claim 8, wherein the sense amplifier identifies the data read from the first memory cell by a magnitude with respect to the data read from the second memory cell.

13. The device according to claim 8, further comprising:
a judgment circuit to judge whether or not the resistance of the magneto-resistive element of the second memory cell is in a predetermined range between the first and second resistances; and a control circuit to command the rewriting of the data with respect to the second memory cell, when the resistance of the magneto-resistive element of the second memory cell is not in a predetermined range as a result of judgment in the judgment circuit.

14. The device according to claim 8, wherein the control circuit controls the value of the current supplied by either one of the row driver and column driver in accordance with a judgment result in the judgment circuit in commanding the rewriting.

15. A semiconductor memory device comprising:
a plurality of word lines formed along a first direction;
a plurality of bit lines formed along a second direction crossing at right angles to the first direction;
a memory cell including a magneto-resistive element;
a memory cell array including memory cells disposed at an intersection of a word line and bit lines;
a row decoder which selects the word line;
a column decoder which selects a bit line;
a driver circuit which supplies write currents to the word line and bit line selected by the row decoder and column decoder, respectively and in which a current value of the write current is variable in accordance with the word line or bit line, the driver circuit including a first current source and a second current source, the first current source supplying the write current, the second current source supplying the write current and having a greater current drive ability than the first current source; and a sense amplifier which amplifies data read from the memory cell selected by the row decoder and column decoder.

16. The device according to claim 15, wherein the first current source is provided for each of the word lines, and the second current source is provided for each of the word lines.

17. The device according to claim 16, wherein the second current source supplies the write current to the word line such that the magneto-resistive element of the memory cell has either a first resistance or a second resistance smaller than the first resistance to perform write operation, and
the first current source supplies the write current to the word line such that the magneto-resistive element of the memory cell has a resistance between the first and second resistances.

18. The device according to claim 17, wherein the memory cells having the resistance between the first and second resistances are arranged at intersections of any one bit line and word lines.

19. The device according to claim 17, wherein the sense amplifier amplifies the data read from the memory cell having either the first or second resistance based on the data held by the memory cell which has a resistance between the first and second resistances.

20. The device according to claim 19, wherein the sense amplifier identifies the data read from the memory cell having either the first or second resistance by a magnitude with respect to the data read from the memory cell which has the resistance between the first and second resistances.

21. The device according to claim 17, further comprising:
a hold circuit which holds the value of the write current required to set the resistance of the magneto-resistive element of the memory cell to a value between the first and second resistances.

22. The device according to claim 17, further comprising:
a judgment circuit to judge whether or not the resistance of the magneto-resistive element of the memory cell is in a predetermined range between the first and second resistances; and
a control circuit to command the rewriting of the data with respect to the memory cell, when the resistance of the magneto-resistive element of the memory cell is not in the predetermined range as a result of judgment in the judgment circuit.

23. The device according to claim 22, wherein the control circuit controls the value of the current supplied by the driver circuit in accordance with a judgment result in the judgment circuit in commanding the rewriting.

24. The device according to claim 15, wherein the second current source supplies the write current to the bit line such that the magneto-resistive elements of the memory cells arranged at the intersections of the word lines and some of the bit lines have either a first resistance or a second resistance smaller than the first resistance to perform write operation, and the first current source supplies the write current to the bit line such that the magneto-resistive elements of the memory cells arranged at the intersections of the word lines and the remaining bit lines have a resistance intermediate between the first and second resistances.

25. The device according to claim 24, wherein the memory cells having the resistance between the first and second resistances are disposed in an intersection of any one bit line and word lines.

26. The device according to claim 25, wherein the sense amplifier amplifies the data read from the memory cell having either the first or second resistance based on the data held by the memory cell which has a resistance between the first and second resistances.

27. The device according to claim 26, wherein the sense amplifier identifies the data read from the memory cell having either the first or second resistance by a magnitude with respect to the data read from the memory cell which has the resistance between the first and second resistances.

28. The device according to claim 24, further comprising:
a hold circuit which holds the value of the write current required to set the resistance of the magneto-resistive element of the memory cell to a value between the first and second resistances.

29. The device according to claim 24, further comprising:
a judgment circuit to judge whether or not the resistance of the magneto-resistive element of the memory cell is in a predetermined range between the first and second resistances; and
a control circuit to command the rewriting of the data with respect to the memory cell, when the resistance of the magneto-resistive element of the memory cell is not in the predetermined range as a result of judgment in the judgment circuit.

30. The device according to claim 29, wherein the control circuit controls the value of the current supplied by the driver circuit in accordance with a judgment result in the judgment circuit in commanding the rewriting.

31. A control method of a semiconductor memory device comprising:
writing first data in a memory cell including a first magneto-resistive element, and writing second data in a reference cell including a second magneto-resistive element, the first magneto-resistive element of the memory cell in which the first data is written having either a first resistance or a second resistance smaller than the first resistance, the second magneto-resistive element of the reference cell in which the second data is written having a resistance between the first and second resistances;
precharging a bit line;
reading the first and second data in the bit line from the memory cell and reference cell; and
amplifying the first data read in the bit line based on the second data,
wherein the memory cell and reference cell are disposed at an intersection of the bit line and word lines crossing at right angles to the bit line, and
an absolute value of the write current supplied to the bit line and word line in writing the second data in the reference cell is smaller than that of the write current supplied to the bit line and word line in reversing the data held in the memory cell to write the first data in the memory cell.

32. The method according to claim 31, wherein the second data is written into the reference cell at a die sort test time.

33. The method according to claim 31, further comprising:
holding information on a write current required in writing the second data in the reference cell in a hold circuit;
verifying whether or not the second data written in the reference cell is normal after writing the second data in the reference cell; and
reading the information held in the hold circuit and using the write current based on the information to write the second data in the reference cell again, when the second data is judged not to be normal as a result of the verification.

34. The method according to claim 31, further comprising:
verifying whether or not the resistance of the magneto-resistive element of the reference cell is in a predetermined range between the first and second resistances, after writing the second data in the reference cell; and changing the value of the write current based on the verification result and writing the second data in the reference cell, when the resistance is judged not to be in the predetermined range as the result of the verification.

35. The method according to claim 31, wherein the write current supplied to the bit line and word line in writing the second data in the reference cell has a value between a minimum write current necessary for reversing the data held in the memory cell and a maximum write current permitted in non-reversing the data.

* * * * *